United States Patent [19]
Komori et al.

[11] Patent Number: 5,652,168
[45] Date of Patent: Jul. 29, 1997

[54] METHOD OF FORMING A SEMICONDUCTOR DEVICE HAVING A CAPACITOR WITH IMPROVED ELEMENT ISOLATION AND OPERATION RATE

[75] Inventors: Shigeki Komori; Katsuhiro Tsukamoto, both of Hyogo-ken, Japan

[73] Assignee: Mitsubishi Denki Kabushiki Kaisha, Tokyo, Japan

[21] Appl. No.: 385,517

[22] Filed: Feb. 8, 1995

Related U.S. Application Data

[62] Division of Ser. No. 26,359, Mar. 4, 1993, Pat. No. 5,412,237.

[30] Foreign Application Priority Data

Mar. 12, 1992 [JP] Japan .................... 4-053835
Jan. 21, 1993 [JP] Japan .................... 5-008475

[51] Int. Cl.$^6$ ....................... H01L 21/70; H01L 27/00
[52] U.S. Cl. .................... 437/60; 437/52; 437/919; 437/47
[58] Field of Search .................... 437/52, 60, 47, 437/919, 162

[56] References Cited

U.S. PATENT DOCUMENTS

| | | | |
|---|---|---|---|
| 5,006,481 | 4/1991 | Chan et al. | 437/52 |
| 5,045,494 | 9/1991 | Choi et al. | 437/60 |
| 5,071,783 | 12/1991 | Taguchi et al. | 437/52 |

FOREIGN PATENT DOCUMENTS

| | | |
|---|---|---|
| 469555 A2 | 2/1992 | European Pat. Off. . |
| 60-111471 | 6/1985 | Japan . |
| 61-57097 | 3/1986 | Japan . |
| 63-51622 | 3/1988 | Japan . |
| 04-88665 | 3/1992 | Japan . |

*Primary Examiner*—Jey Tsai
*Attorney, Agent, or Firm*—Lowe, Price, LeBlanc & Becker

[57] ABSTRACT

A lower electrode of a capacitor for use in a semiconductor device includes a first semiconductor layer having a predetermined impurity concentration and a second semiconductor layer having an impurity concentration higher than that of the first semiconductor layer. As a result, intensification of an electric field at an end portion of the capacitor can be reduced. In addition, a word line is formed of a buffer layer and a main conductor layer to reduce a parasitic capacitance between the lower electrode of the capacitor and the word line.

17 Claims, 21 Drawing Sheets

PRIOR ART

METHOD OF FORMING A SEMICONDUCTOR DEVICE HAVING A CAPACITOR WITH IMPROVED ELEMENT ISOLATION AND OPERATION RATE

This application is a division of application Ser. No. 08/026,359 filed Mar. 4, 1993 U.S. Pat. No. 5,412,237.

BACKGROUND OF THE INVENTION

1. Field of the Invention

The present invention relates generally to semiconductor devices and a method of manufacturing the same, and more particularly, to a semiconductor device with an improved operation rate and improved element isolation and a method of manufacturing such semiconductor device.

2. Description of the Background Art

In order to execute processing or operation of information in a digital system, memory devices (IC memories) have been recently developed which once store binary-decoded information or data which are read as necessary.

IC memories are classified into several groups according to their functions, one of which is a DRAM (Dynamic Random Access Memory) which stores information according to presence/absence of charges stored in a capacitor, and which is re-written (refreshed) by charging at constant time intervals and loses all its storage when power is off (volatile).

With reference to FIG. 26, the DRAM is basically constituted by a memory cell array 100 including numerous semiconductor memory devices, an X decoder 110 and a Y decoder 120 necessary for inputting/outputting and an input/output control circuit 130.

With reference to FIG. 27, semiconductor memory devices 140 in the memory cell array 100 are disposed at cross-over points between a plurality of word lines $WL_1$, $WL_2$, ... $WL_n$ extending in a row direction and a plurality of bit lines $BL_1$, $BL_2$, ... $BL_n$ extending in a column direction.

Again with reference to FIG. 26, an address signal for designating a position of a target semiconductor device 140 is applied from an X address 110a and a Y address 120a. Writing to and reading of the target semiconductor device 140 is carried out by an input/output control signal 130a. The X decoder 110 and the Y decoder 120 are circuits for selecting an address by using an address signal.

The above-described semiconductor device 140 is a memory for storing information according to presence/absence of charges stored in a capacitor. FIG. 28 shows an equivalent circuit of the semiconductor device 140. The semiconductor device 140 includes one field effect transistor 150 and one capacitor 160. Reading is carried out by determining the presence/absence of charges stored in the capacitor 160 by a current flowing through a capacitance $C_D$ of a precharged bit line to the field effect transistor 150.

FIG. 29 is a plan view of the memory cell array 100. Bit lines 60 are disposed in a column direction to come in contact, at bit line contact portions 59, with impurity diffusion regions 54 provided on a semiconductor substrate 51. Word lines 55 are disposed in a row direction.

With reference to FIG. 30, an internal structure of the semiconductor memory device 140 will be described. FIG. 30 is a sectional view taken along line X—X of FIG. 29.

An element isolation region 52 is formed on a main surface of a p type semiconductor substrate 51. In an active region surrounded by the element isolation region 52, a word line 55 is formed on the main surface of the p type semiconductor substrate 51 through an insulation film 70.

n type impurity regions 53 and 54 are formed from the surface of the p type semiconductor substrate 51 down to a predetermined depth, at a position in which the regions sandwich the above word line 55.

The word line 55 has an upper surface and a side surface covered with an insulation film 71. Formed on the upper surface side of the insulation film 71 is a first semiconductor layer of polysilicon with n type impurities doped along its surface. The first semiconductor layer 57 is electrically connected to the impurity region 53 at a contact hole 71a provided in the insulation film 71.

An insulation film 61 of an oxide film is formed along the surface of the first semiconductor layer 57. A second semiconductor layer 58 of polysilicon with n type impurities doped is formed along the surface of the insulation film 61. Formed on the surface of the second semiconductor layer 58 is an interconnection layer 60 through an interlayer insulation film 59. The interconnection layer 60 is electrically connected to the impurity region 54 at a contact hole 59a provided in the interlayer insulation film 59.

In the semiconductor device 140 having the above-described structure, the word lines 55 and the impurity regions 53 and 54 constitute a field effect transistor. Furthermore, the first semiconductor layer 57 forms a lower electrode, the insulation layer 61 forms a dielectric layer and the second semiconductor layer 58 forms an upper electrode, which together constitute a capacitor.

A method of manufacturing the semiconductor device 140 of the above-described structure will be described in the following with reference to FIGS. 31 to 45.

First with reference to FIG. 31, an element isolation region 52 is formed on a main surface of a p type semiconductor substrate 51 by a LOCOS method. With reference to FIG. 32, an oxide film 70 is formed entirely on the main surface of the semiconductor substrate 51. With reference to FIG. 33, a polysilicon layer 55a is formed on the entire surface of the semiconductor substrate 51. With reference to FIG. 34, a resist film 72 of a predetermined configuration is formed on the surface of the polysilicon layer 55a by photolithography. With reference to FIG. 35, the polysilicon layer 55a and the oxide film 70 are anisotropically etched by using the resist film 72 as a mask to form a word line 55.

Then with reference to FIG. 36, after a removal of the resist film 72, phosphorus is implanted into the main surface of the semiconductor substrate 51 by using the word line 55 and the element isolation region 52 as masks to form n type impurity regions 53 and 54. With reference to FIG. 37, an oxide film 71 is deposited on the entire surface of the semiconductor substrate 51 by the CVD method. With reference to FIG. 38, the oxide film 71 is etched by anisotropic etching, etc. to form a contact hole 71a in communication with the impurity region 53.

Then with reference to FIG. 39, polysilicon including high-concentration phosphorus is deposited along the surfaces of the insulation film 71 and the contact hole 71a to form a first semiconductor layer 57. With reference to FIG. 40, a resist film 21 of a predetermined configuration is formed on the surface of the first semiconductor layer 57 and the first semiconductor layer 57 virtually above the impurity region 54 is removed by anisotropic etching. With reference to FIG. 41, after the removal of the resist film 21, an insulation layer 61 of an oxide film is formed on the entire surface of the first semiconductor layer 57. With reference to FIG. 42, a second semiconductor layer 58 of polysilicon including high-concentration phosphorus is formed on the surfaces of the insulation layer 61 and the oxide film 71.

Then with reference to FIG. 43, a resist film 22 of a predetermined configuration is formed on the surface of the second semiconductor layer 58 and the second semiconductor layer 58 virtually above the impurity region 54 is removed by anisotropic etching. With reference to FIG. 44, after the removal of the resist film 22, an interlayer insulation film 59 is formed on the entire surface of the second semiconductor layer 58. With reference to FIG. 45, after sintering of the interlayer insulation film 59 and planarization of the surface, a contact hole 59a reaching the impurity region 54 is formed by photolithography etc. Thereafter, a semiconductor device 140 as shown in FIG. 30 is completed by forming an interconnection layer 60 of polysilicon or the like on the surface of the interlayer insulation film 59 and in the contact hole 59a.

However, with reference to FIG. 45, the semiconductor device having the above-described structure has its capacitor liable to destruction due to a concentration of an electric field because the capacitor is sharp at the point A encircled by a line. In addition, because of a high impurity concentration of the first semiconductor layer 57, a parasitic capacitance is generated between the word line 55 and the first semiconductor layer 57. As a result, a word line further from a word line drive circuit (not shown) takes more time in a voltage change, thereby lowering an operation rate of the semiconductor device. Similarly, a parasitic capacitance is generated between the interconnection layer 60 and the second semiconductor layer 58 to reduce an operation rate of the semiconductor device.

On the other hand, impurities included in the first semiconductor layer diffuse into an impurity region by a heat treatment step, etc. in manufacturing process, thereby increasing a depth of the diffusion of the impurity region on the surface of a substrate.

Again with reference to FIGS. 41 to 45, it can be seen that the impurity diffusion region is greatly enlarged through the respective steps. In particular, in a heat treatment for planarization of the interlayer insulation film 59, impurities diffuse deep into the substrate even by a gentle heat treatment carried out at about 850° C. for two hours. FIG. 46 shows a profile of an impurity concentration at a section taken along line X—X of FIG. 30. The deeper the impurity region provided in the substrate becomes as described above, the smaller becomes the distance between the impurity region and an impurity region of its adjacent element as shown in FIG. 46. As a result, depletion layers 80 generated at the interface of the impurity diffusion region connect to each other to cause punch through, resulting in deterioration of semiconductor element characteristics and defects of storage.

Means for solving such problems include a method of suppressing impurities from diffusing into an impurity region by decreasing a concentration of impurities included in the first semiconductor layer and a method of lowering a heat treatment temperature for planarization of an interlayer insulation film. According to the diffusion depression method, however, when the impurity concentration of the first semiconductor layer is decreased, a resistance value of interconnection of the first conductor layer is increased to reduce a capacitance of a capacitor. According to the latter method, planarization of the interlayer insulation film is not so sufficient that the surface of the interlayer insulation film is staged, which adversely affects a formation of an interconnection layer etc. in the following steps. Both method consequently lower element characteristics.

SUMMARY OF THE INVENTION

An object of the present invention is to provide a semiconductor device with highly reliable characteristics by preventing an electric field from being intensified at an end portion of a capacitor, and a method of manufacturing such device.

Another object of the present invention is to provide a semiconductor device with highly reliable characteristics while enhancing a processing speed, and a method of manufacturing such device.

A further object of the present invention is to provide a semiconductor device with highly reliable characteristics by suppressing impurity diffusion from a first semiconductor layer to an impurity diffusion region.

According to one aspect of the present invention, the semiconductor device is provided with a second semiconductor layer including impurities whose concentration is higher than that of a first semiconductor layer and formed along the surface of the first semiconductor layer.

Such provision reduces intensification of an electric field at the end portion of a capacitor constituted by the first semiconductor layer and the second semiconductor layer, thereby preventing destruction of the capacitor.

According to another aspect of the present invention, the semiconductor device is provided with a conductor layer, and a first semiconductor layer formed on the conductor layer with an interlayer insulation film provided therebetween. Provided on the first semiconductor layer is a second semiconductor layer including impurities whose concentration is higher than that of the first semiconductor layer.

As a result, a parasitic capacitance between a lower electrode of the capacitor constituted by the first semiconductor layer and the second semiconductor layer and the conductor layer is reduced to obtain a high-operation rate of the semiconductor device.

According to a further aspect of the present invention, the semiconductor device is provided with first and second conductor layers with an insulation film provided therebetween. The first conductor layer and the second conductor layer further include first and second buffer layers at regions adjacent to the insulation film, respectively. Provided on the opposite sides, to the insulation film, of the first and the second buffer layers are first and second main conductor layers, respectively.

This reduces a parasitic capacitance between the first conductor layer and the second conductor layer to increase an operation rate of the semiconductor device.

In one aspect, a method of manufacturing the semiconductor device according to the present invention includes a step of forming a first layer and then a second semiconductor layer including impurities of a predetermined concentration on the first layer. With such structure, the high-concentration impurities doped in the second semiconductor layer should pass through the first layer in order to diffuse into an impurity region. This results in prevention of an expansion of the impurity region, the expansion caused due to diffusion of the impurities included in the second semiconductor layer into the impurity region.

In another aspect, the method of manufacturing the semiconductor device according to the present invention includes a step of forming a native oxide film between the first semiconductor layer and the second semiconductor layer, which further suppresses diffusion of the impurities included in a lower electrode into the impurity region at a heat treatment in respective manufacturing steps, thereby preventing the impurity region from expanding.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment of a DRAM, which is a semiconductor device according to the present invention, will be described in the following with reference to the figures. Since the present embodiment has the same operation principle, etc. as those of the conventional DRAM, description will be given only to a different structure and a manufacturing method thereof.

Figure 1:
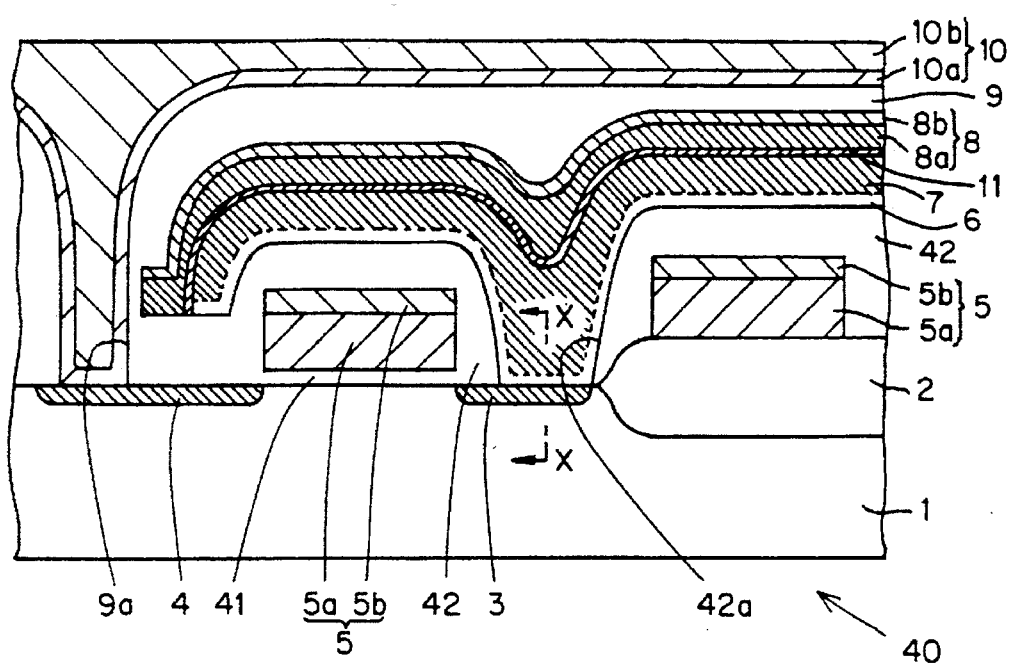
FIG. 1 is a sectional view of a semiconductor device according to a first embodiment of the present invention.
Figure 29:
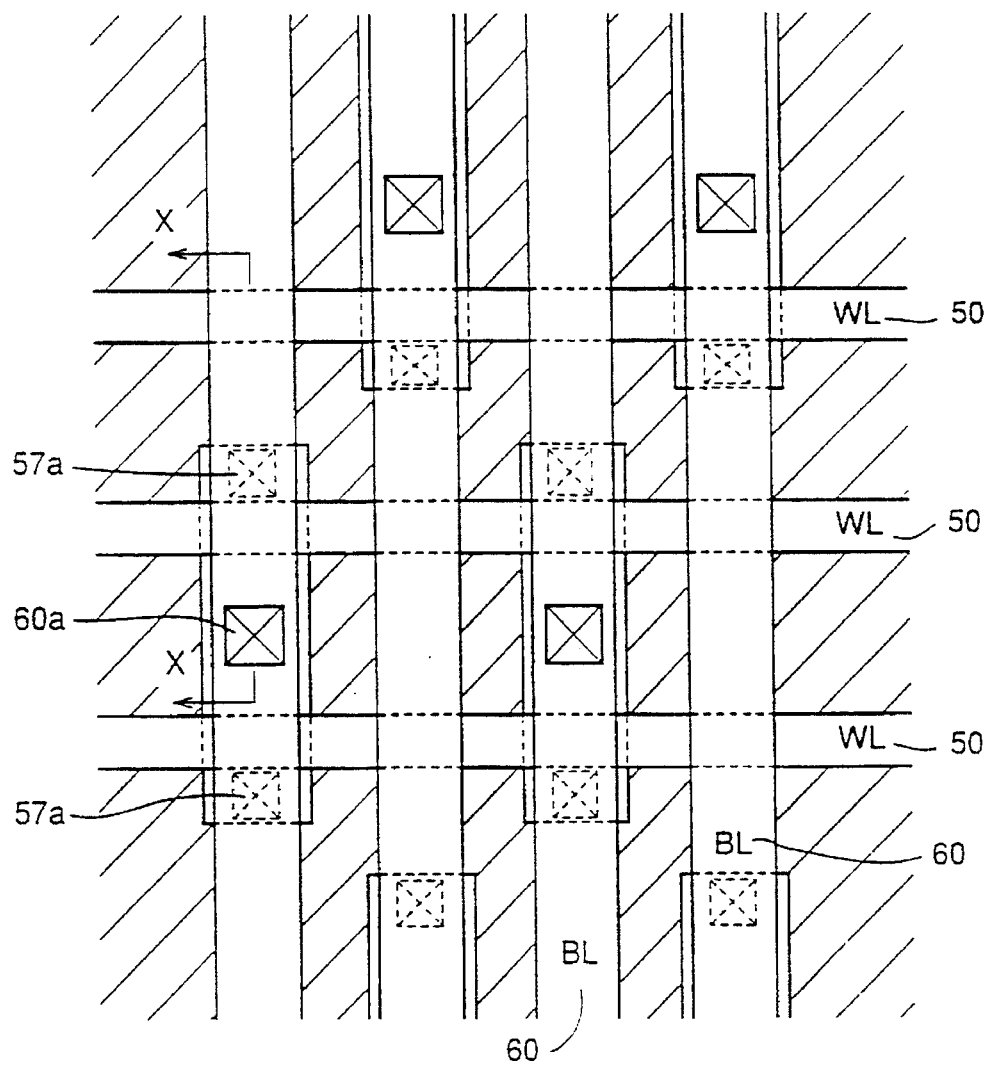
FIG. 29 is a diagram showing a plane arrangement of the memory cell array.
Figure 30:
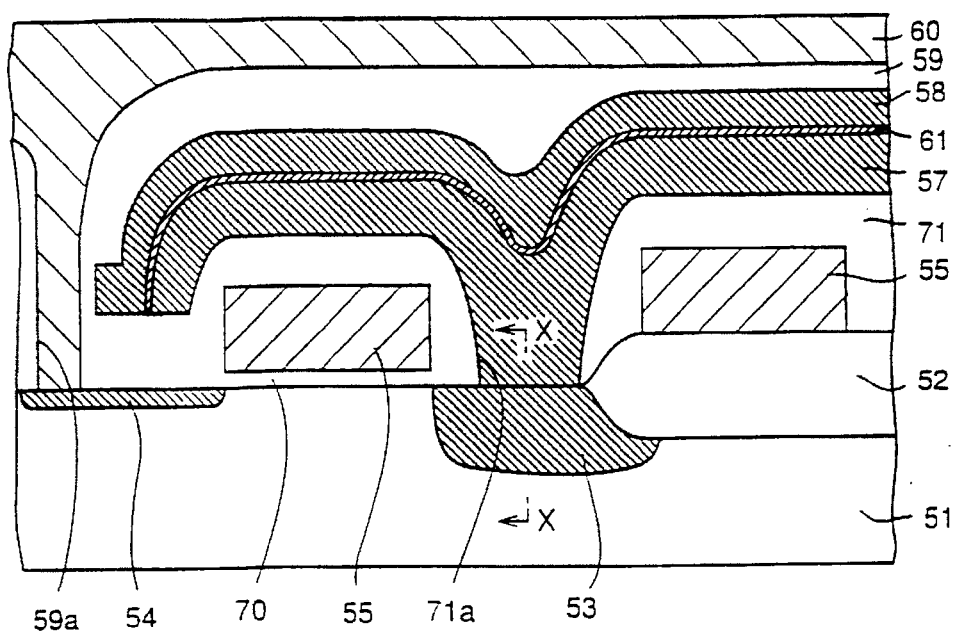
FIG. 30 is a diagram showing a sectional arrangement of a conventional semiconductor device.
Figure 31:
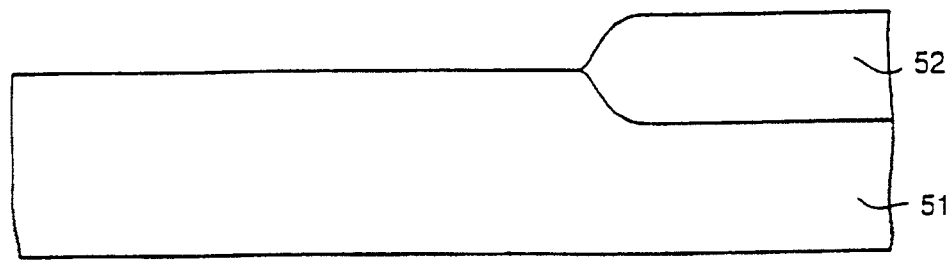
FIGS. 31 to 45 are diagrams showing manufacturing steps of a semiconductor device in a conventional manufacturing method.
Figure 32:
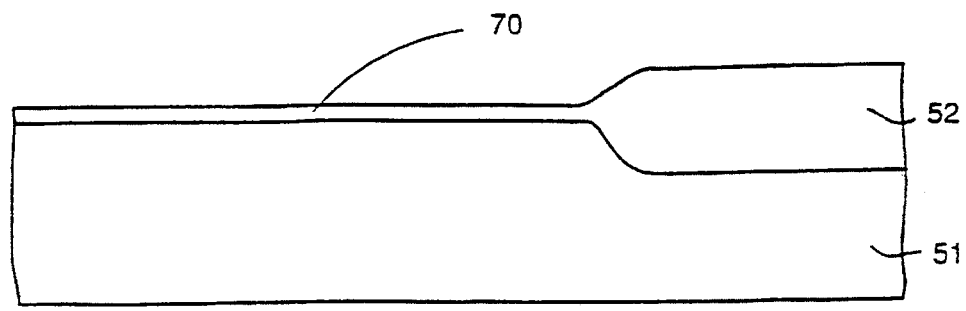
Figure 33:
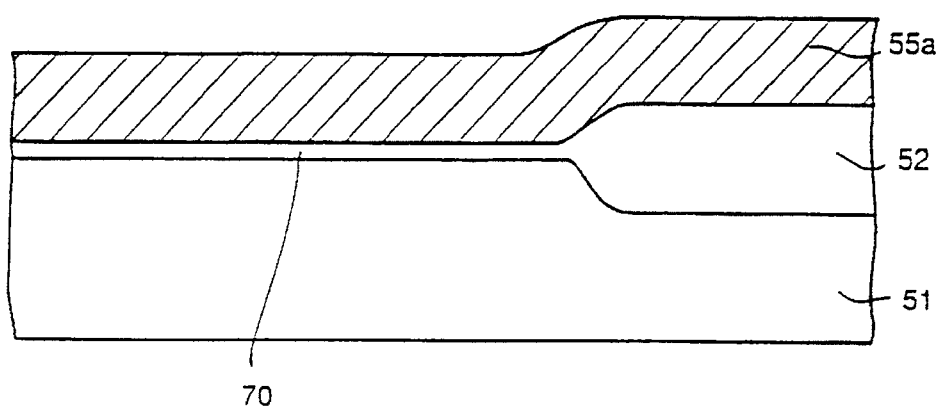
Figure 34:
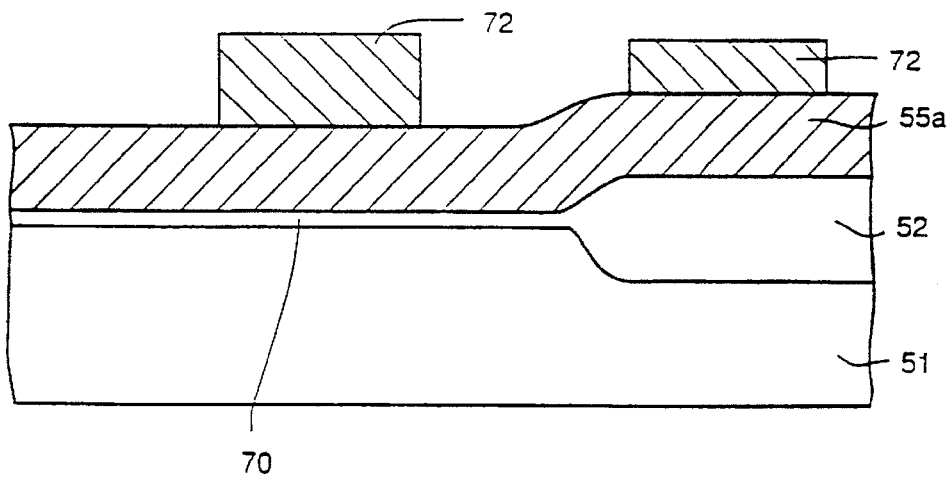
Figure 35:
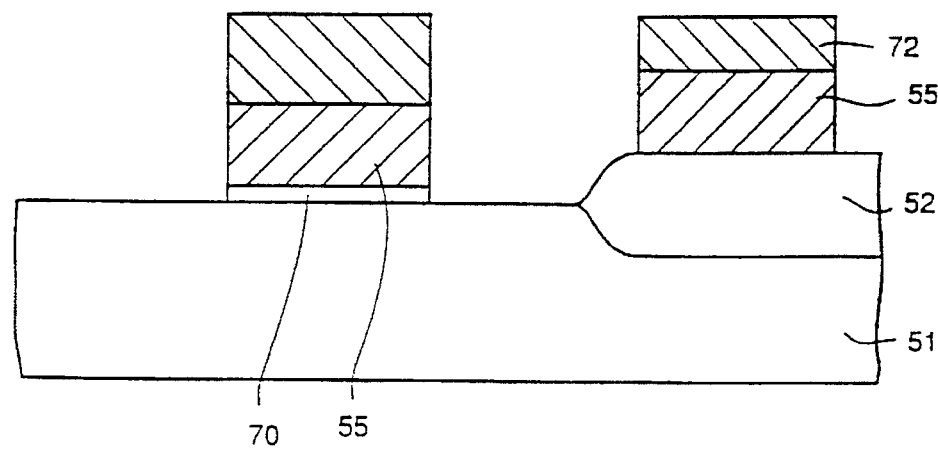
Figure 36:
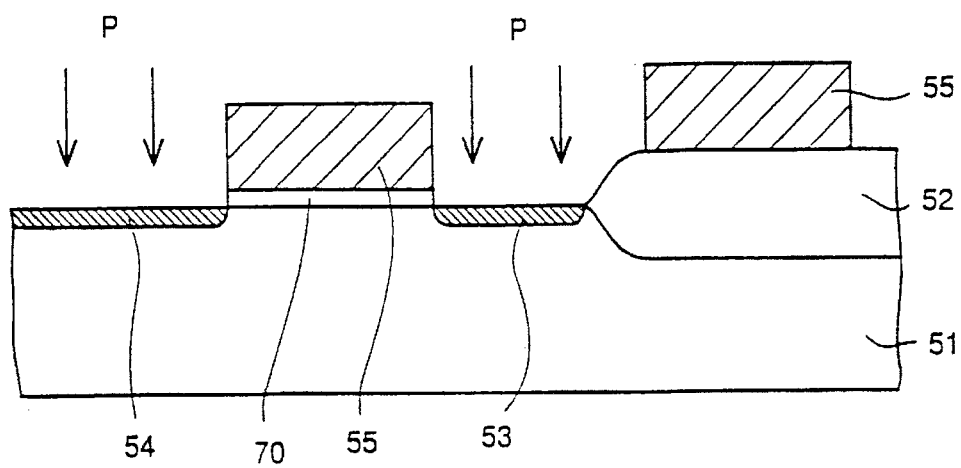
Figure 37:
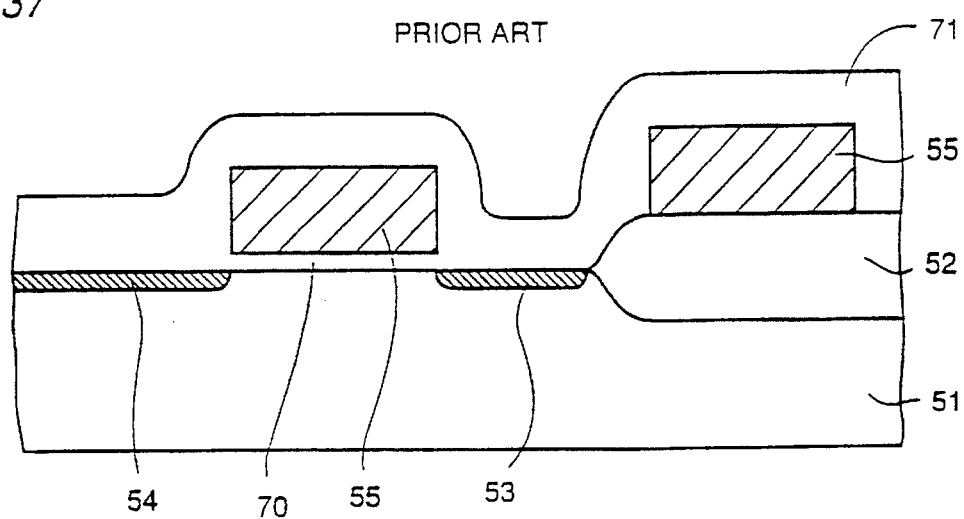
Figure 38:
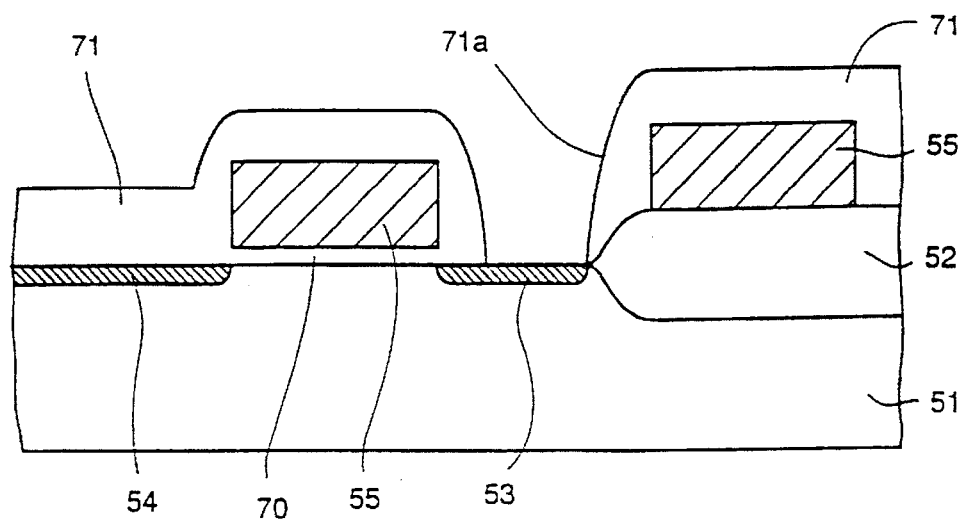
Figure 39:
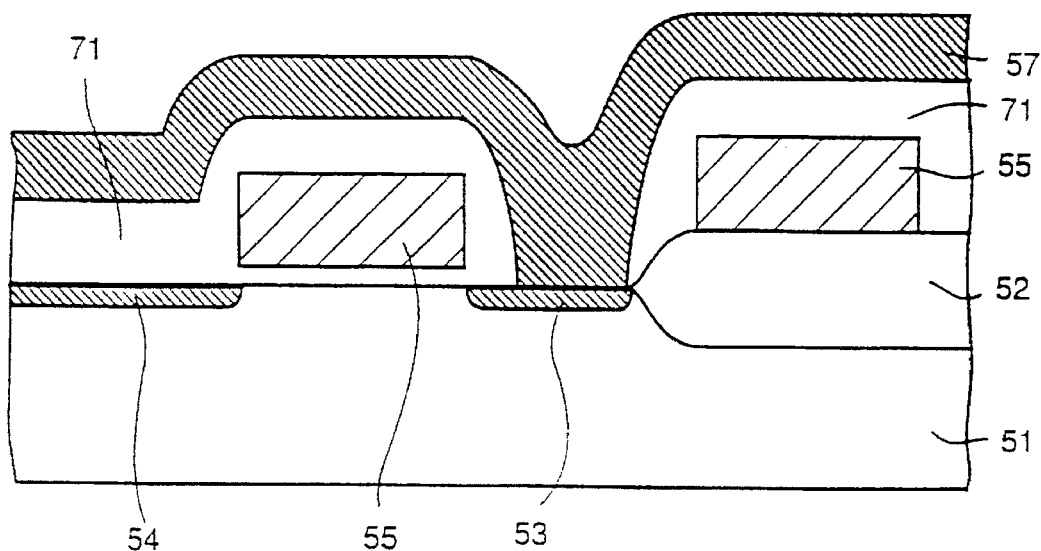
Figure 40:
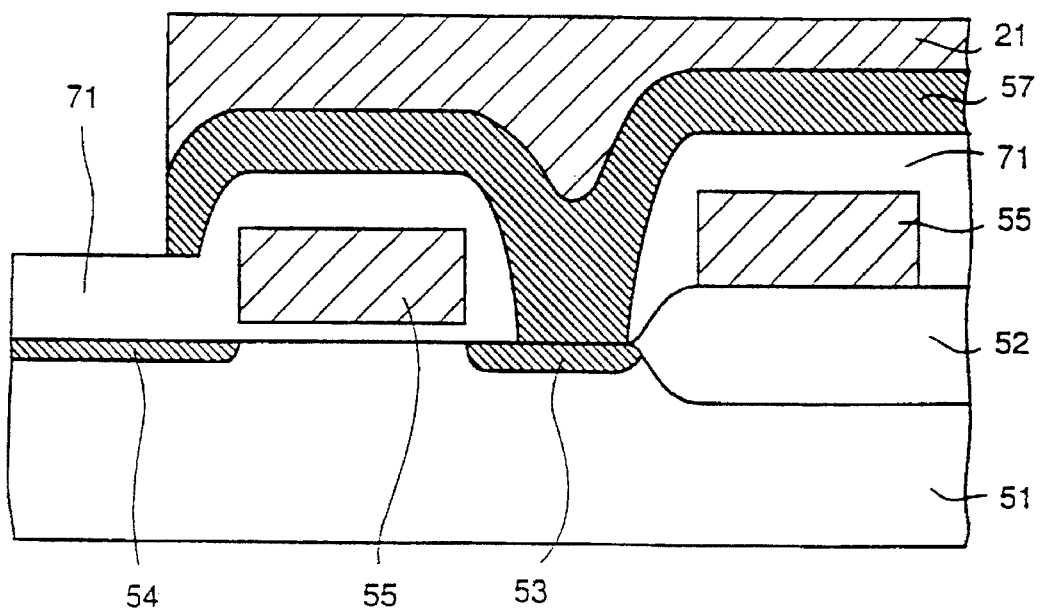
Figure 41:
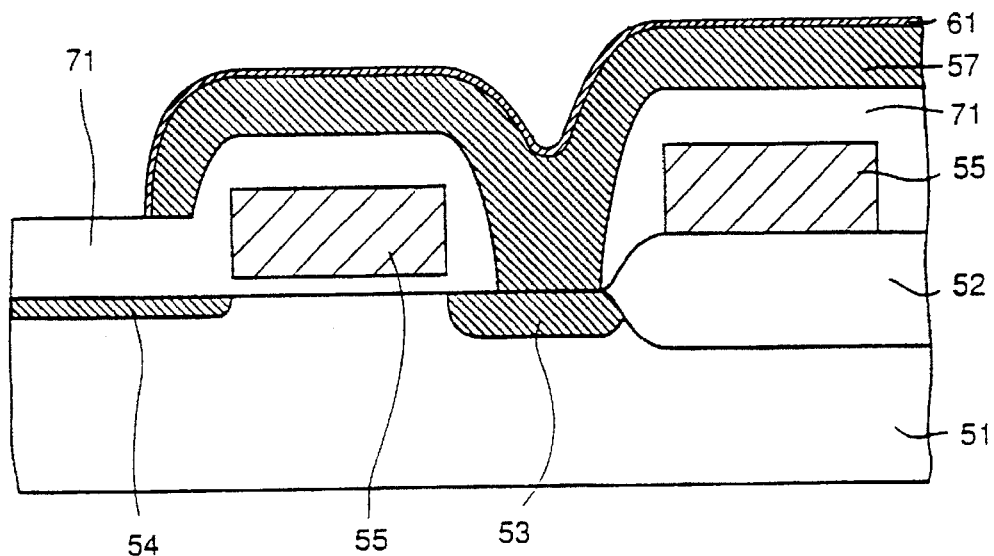
Figure 42:
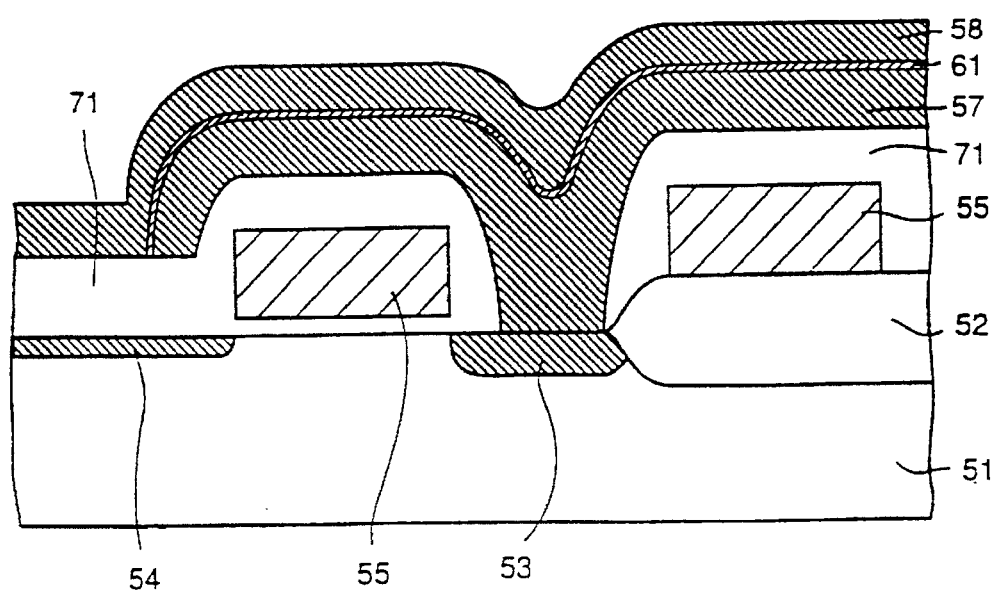
Figure 43:
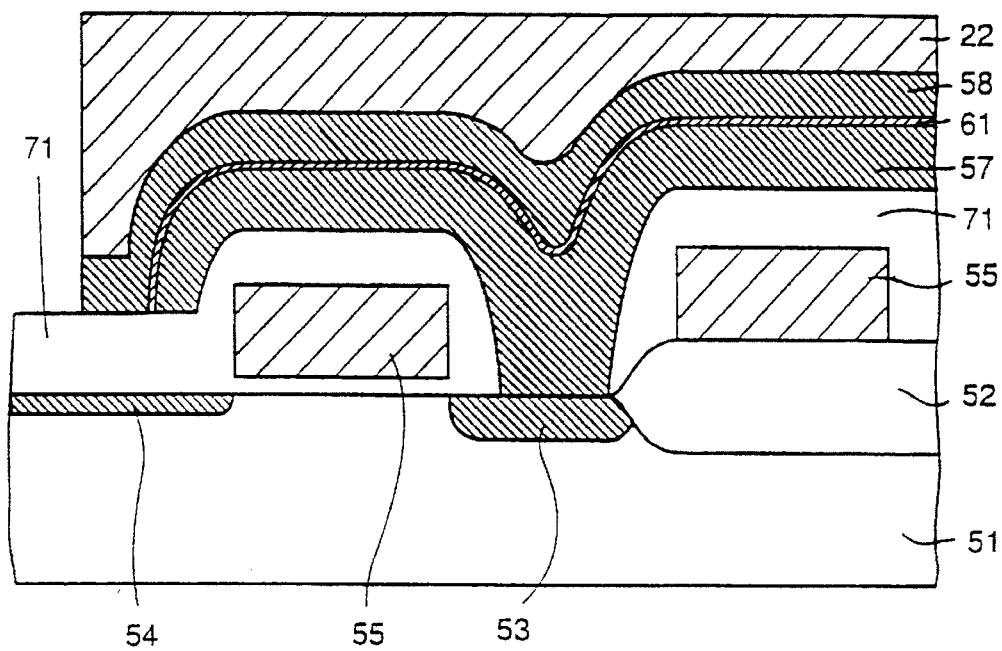
Figure 44:
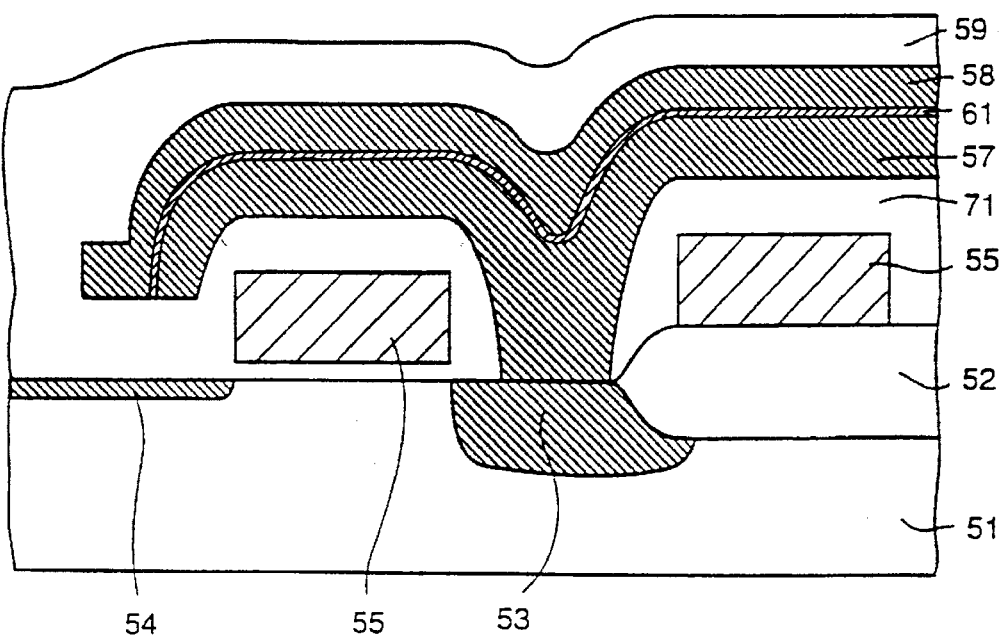
Figure 45:
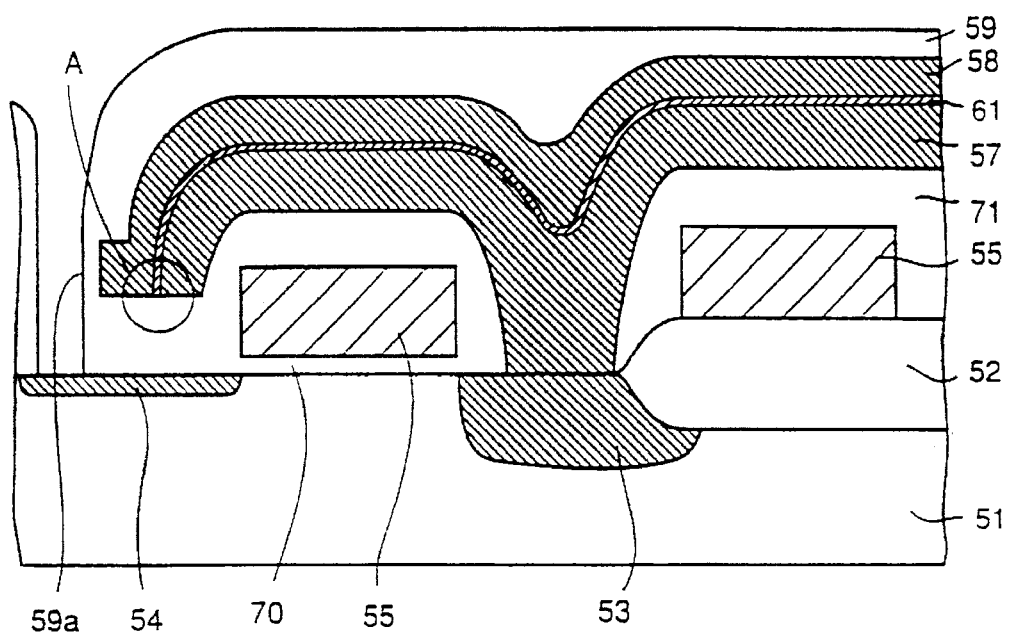

With reference to FIG. 1, a structure of a semiconductor device 40 will be described. FIG. 1 is a sectional view corresponding to a sectional view taken along X—X of FIG. 29 showing the previously described conventional semiconductor device.

An element isolation region 2 of $SiO_2$ or the like is formed at a main surface of a p type semiconductor substrate 1. In an active region surrounded by the element isolation region 2, a word line 5 is formed on the main surface of the p type semiconductor substrate 1 with an insulation film 41 of $SiO_2$ etc., provided therebetween. The word line 5 includes a main conductor layer 5a of polysilicon etc. with phosphorus doped as n type impurities having an impurity concentration of about $1 \times 10^{19}$ atoms $cm^{-3}$–$1 \times 10^{21}$ atoms $cm^{-3}$ provided in its lower surface and a buffer layer 5b of polysilicon with phosphorus doped as n type impurities having an impurity concentration of about $1 \times 10^{14}$ atoms $cm^{-3}$–$1 \times 10^{19}$ atoms $cm^{-3}$ provided in its upper surface.

N type impurity regions 3 and 4 of a concentration of $1 \times 10^{17}$ atoms $cm^{-3}$–$1 \times 10^{21}$ atoms $cm^{-3}$ are formed from the surface of the p type semiconductor substrate 1 down to a predetermined depth so as to have the word line 5 sandwiched therebetween.

The word line 5 has its upper surface and side surfaces covered with an insulation film 42 of $SiO_2$ or the like. Formed on and along the upper side of the insulation film 42 is a first semiconductor layer 6 of polysilicon with phosphorus of a concentration on the order of $1 \times 10^{14}$ atoms $cm^{-3}$–$1 \times 10^{19}$ atoms $cm^{-3}$ doped as n type impurities. The first semiconductor layer 6 electrically connects with the impurity diffusion region 3 at a contact hole 42a provided in the insulation film 42.

A second semiconductor layer 7 of polysilicon with phosphorus of a concentration on the order of $1 \times 10^{19}$ atoms $cm^{-3}$–$1 \times 10^{21}$ atoms $cm^{-3}$ doped as n type impurities is formed along the surface of the first conductor layer 6. An insulation layer 11 of $SiO_2$ or the like is formed along the surface of the second semiconductor layer 7. A third semiconductor layer 8 is formed along the surface of the insulation layer 11.

The third semiconductor layer 8 includes a main conductor layer 8a of polysilicon with phosphorus doped as n type impurities having a concentration of about $1 \times 10^{19}$ atoms $cm^{-3}$–$1 \times 10^{21}$ atoms $cm^{-3}$ provided in its upper surface and a buffer layer 8b of polysilicon with phosphorus doped as n type impurities having a concentration of about $1 \times 10^{14}$ atoms $cm^{-3}$–$1 \times 10^{19}$ atoms $cm^{-3}$ provided in its upper surface.

An interconnection layer 10 is formed on the surface of the third semiconductor layer 8 with an interlayer insulation film 9 of $SiO_2$ etc. provided therebetween. The interconnection layer 10 is electrically connected to the impurity diffusion region 4 at a contact hole 9a provided at the interlayer insulation film 9. The interconnection layer 10 includes a buffer layer 10a of polysilicon with phosphorus doped as n type impurities having a concentration of about $1 \times 10^{14}$ atoms $cm^{-3}$–$1 \times 10^{19}$ atoms $cm^{-3}$ provided in its lower surface and a main conductor layer 10b of polysilicon with phosphorus doped as n type impurities having a concentration of about $1 \times 10^{19}$ atoms $cm^{-3}$–$1 \times 10^{21}$ atoms $cm^{-3}$ provided in its upper layer.

In the semiconductor device 40 of the above-described arrangement, the word line 5 and the impurity diffusion regions 3 and 4 constitute a field effect transistor. Then, the first semiconductor layer 6 and the second semiconductor layer 7 form a lower electrode, the insulation layer 11 forms a dielectric layer and the third semiconductor layer 8 forms an upper electrode, which together constitute a capacitor.

With the above-described arrangement, a semiconductor layer at a part encircled and indicated by A has a two-layer structure including low-concentration and high-concentration impurity diffusion regions, as shown in FIG. 1. Such structure reduces intensification of an electric field.

In addition, the lower electrode of the capacitor which is formed by the semiconductor layers 6 and 7 has its impurity concentration lower than that of a conventional lower electrode and therefore a processing speed can be enhanced.

A method of manufacturing the semiconductor device 40 having the above-described arrangement will be described with reference to FIGS. 2 to 17.

Figure 2:
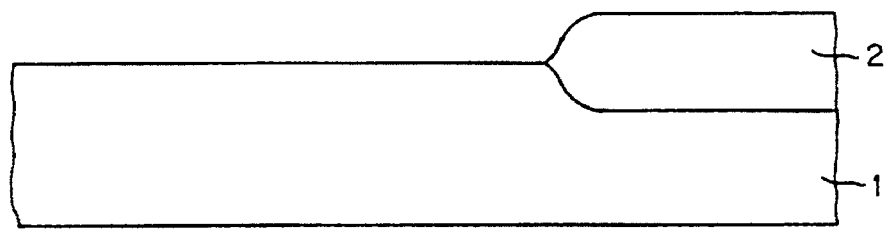
FIGS. 2 to 18 are views showing manufacturing steps of a semiconductor device in a manufacturing method according to the present invention.
Figure 3:
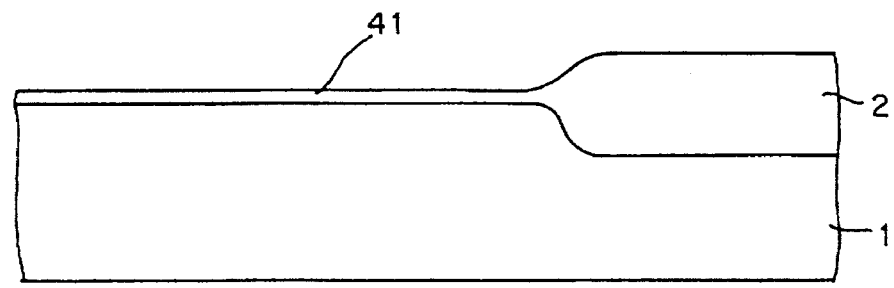
Figure 4:
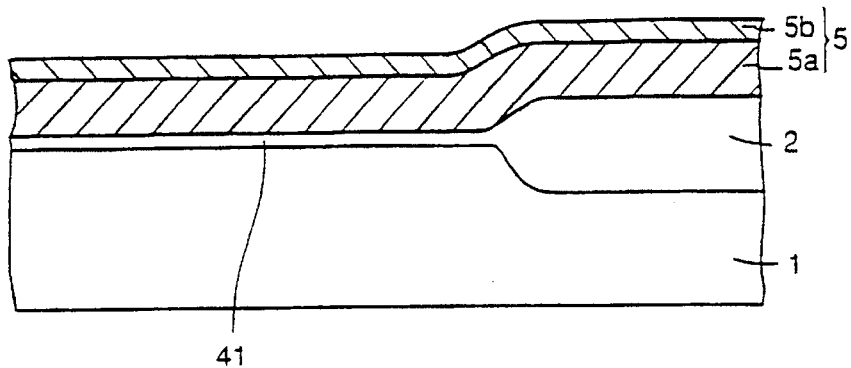

First with reference to FIG. 2, an element isolation region 2 of $SiO_2$ is formed on the main surface of a p type semiconductor substrate 1 by a LOCOS method. With reference to FIG. 3, an oxide film 41 of $SiO_2$ is formed on the entire surface of the semiconductor substrate 1 to have a thickness of about 50 Å–500 Å. With reference to FIG. 4, a polysilicon layer 5a is formed to have a thickness of about 500 Å–5000 Å on the entire surface of the semiconductor substrate 1. Thereafter, a buffer layer 5b of polysilicon having an impurity concentration of $1 \times 10^{14}$ atoms $cm^{-3}$–$1 \times 10^{19}$ atoms $cm^{-3}$ is formed on the main conductor layer 5a.

Figure 5:
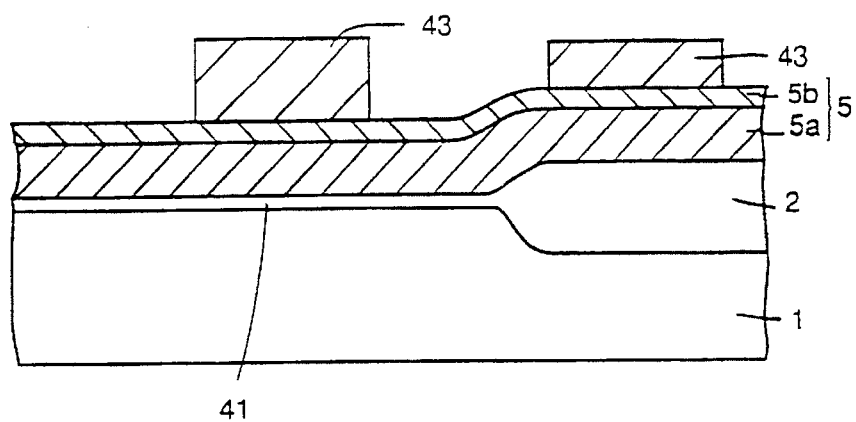
Figure 6:
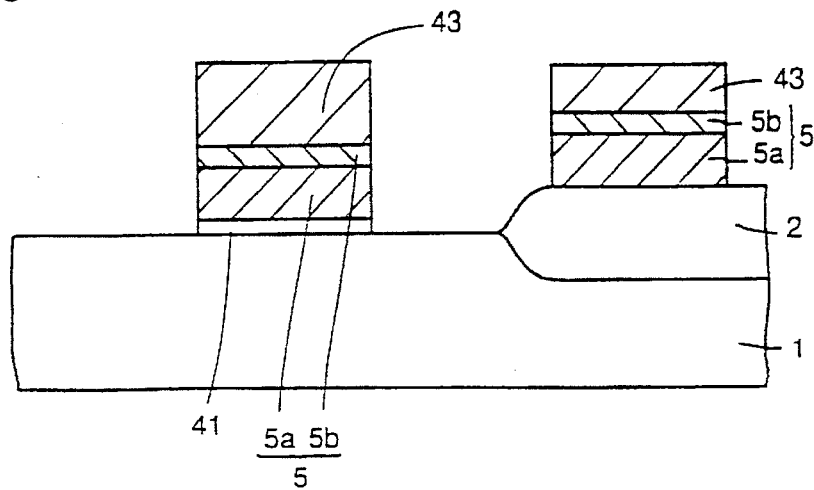

With reference to FIG. 5, a resist film 43 having a predetermined configuration is formed on the surface of the buffer layer 5b by photolithography. With reference to FIG. 6, the buffer layer 5b and the main conductor layer 5a are etched to have a predetermined configuration to form a word line 5 by using the resist film 43 as a mask.

Figure 7:
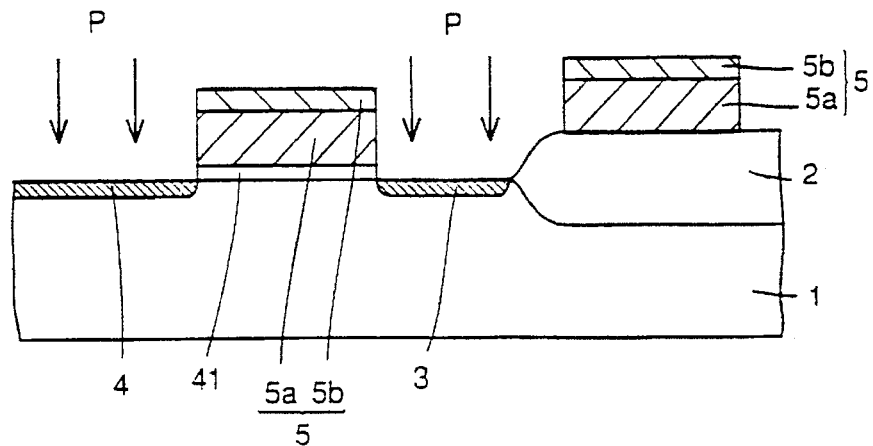
Figure 8:
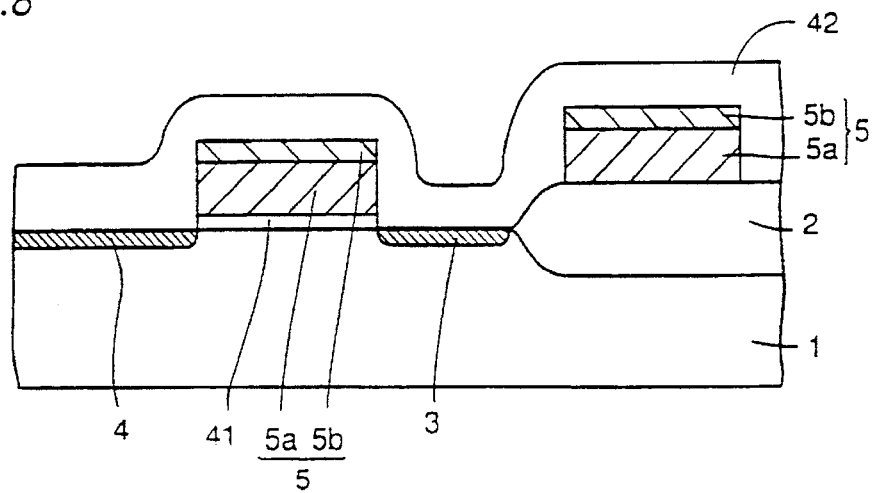
Figure 9:
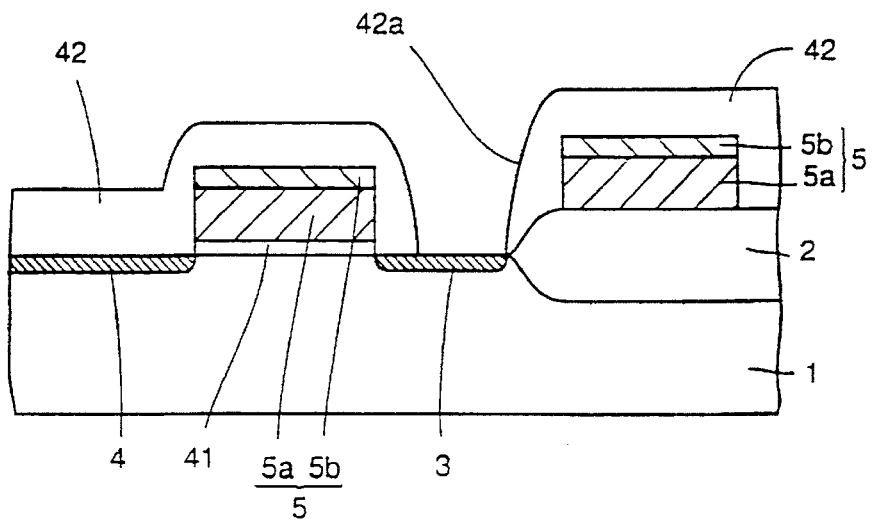
Figure 10:
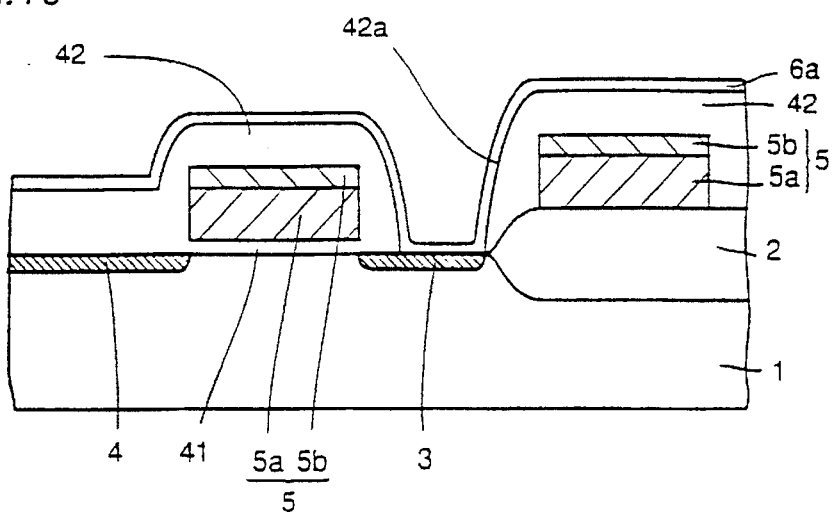
Figure 11:
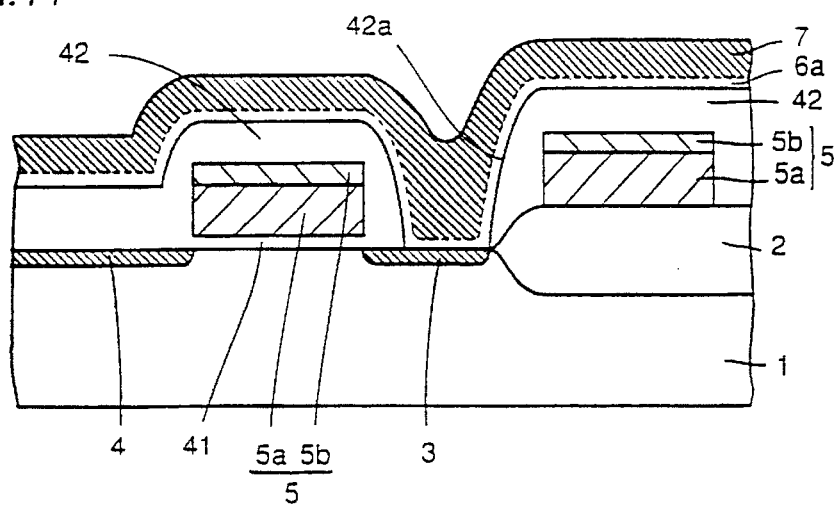

With reference to FIG. 7, after a removal of the resist film 43, phosphorus is implanted in the main surface of the semiconductor substrate 1 by using the word line 5 and the element isolation region 2 as masks to form n type impurity regions 3 and 4 of a concentration on the order of $1 \times 10^{19}$ atoms $cm^{-3}$–$1 \times 10^{21}$ atoms $cm^{-3}$. With reference to FIG. 8, an oxide film 42 of $SiO_2$ is deposited on the entire surface of the semiconductor substrate 1 by the CVD method. With reference to FIG. 9, the insulation film 42 is anisotropically etched to form a contact hole 42a reaching the impurity region 3. With reference to FIG. 10, polysilicon with no impurity doped is deposited to have a thickness of about 200 Å–5000 Å along the surfaces of the insulation film 42 and the contact hole 42a to form a first semiconductor layer 6a. With reference to FIG. 11, polysilicon with n type impurities of a concentration on the order of $1 \times 10^{19}$ atoms $cm^{-3}$–$1 \times 10^{21}$ atoms $cm^{-3}$ doped is deposited to have a thickness of about 200 Å–5000 Å along the surface of the first semiconductor layer 6a to form a second semiconductor layer 7.

Figure 12:
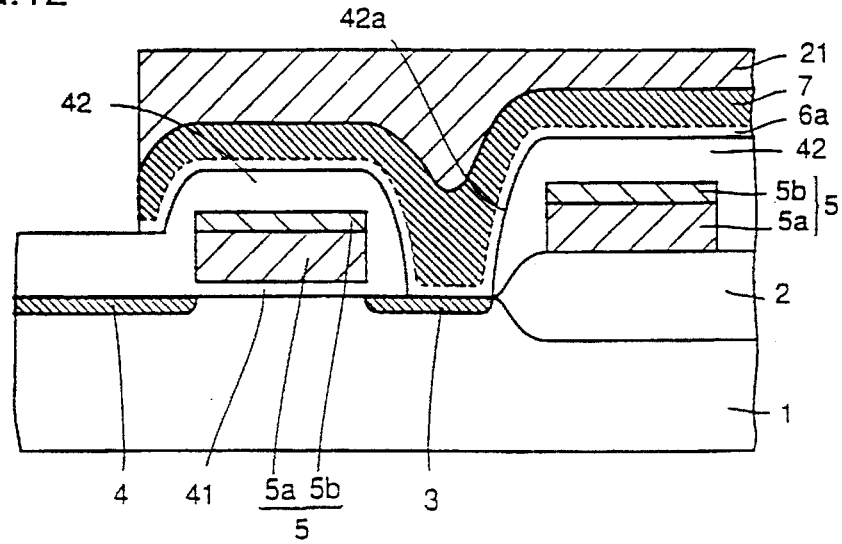
Figure 13:
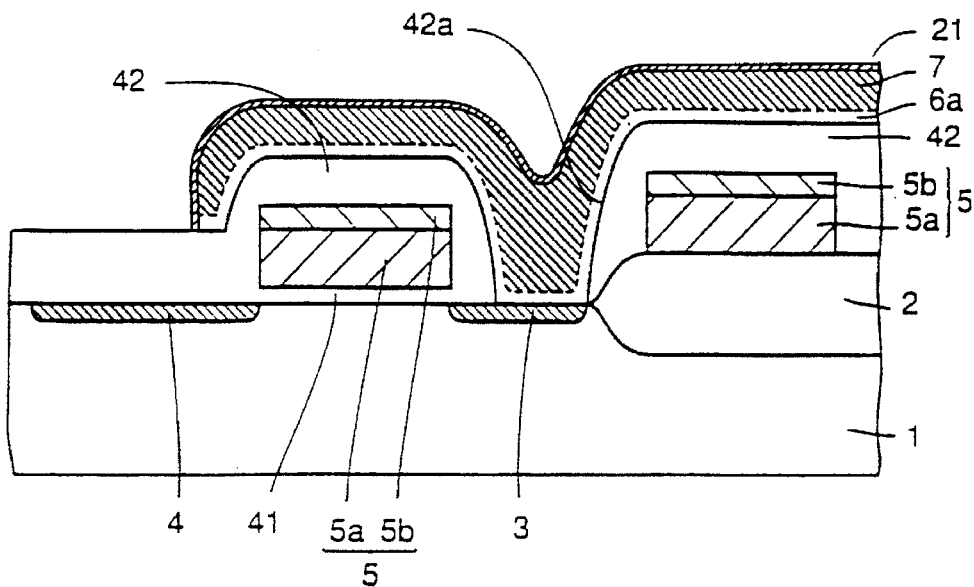
Figure 14:
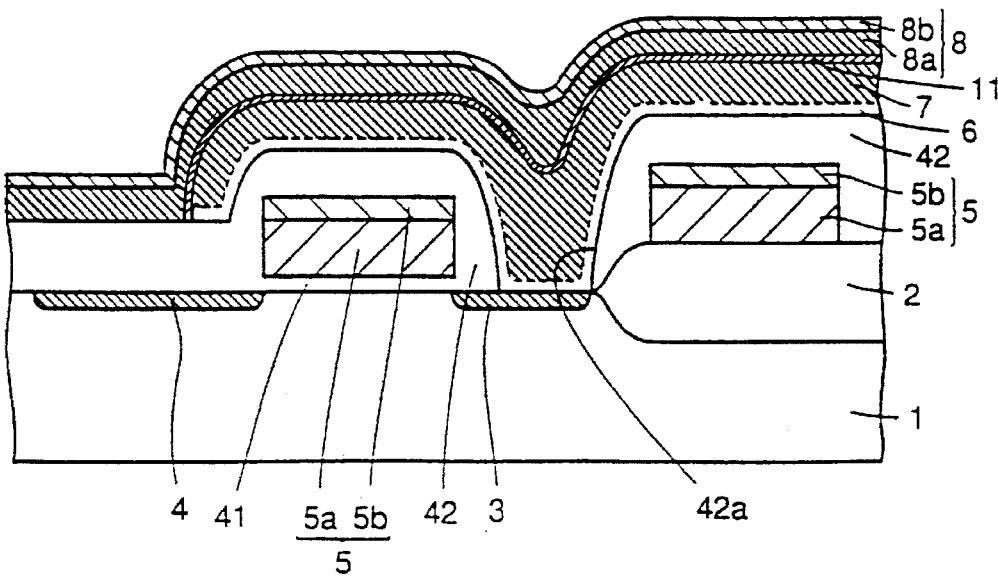
Figure 15:
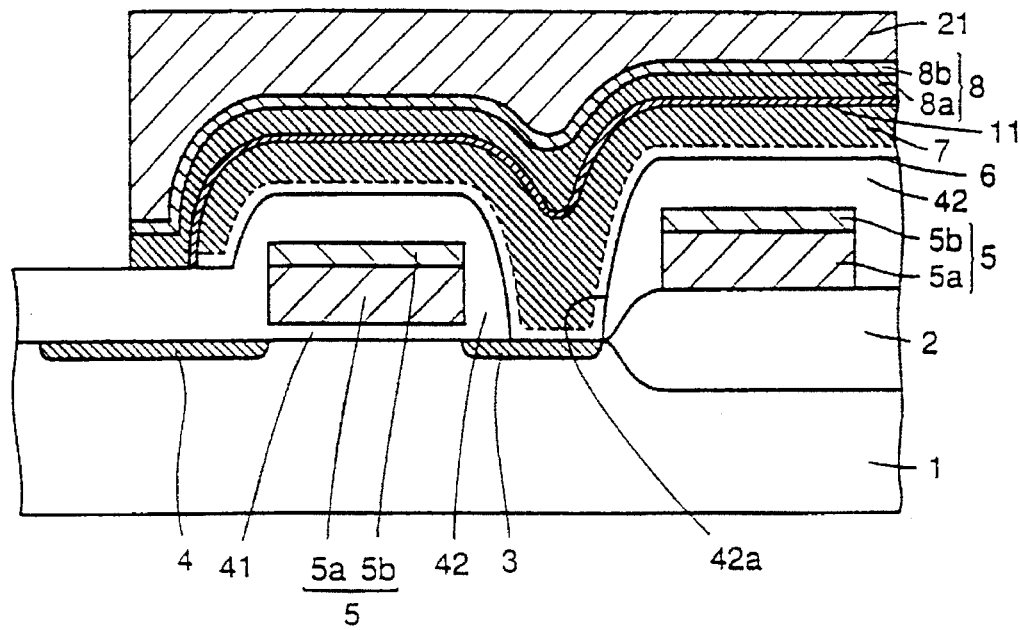
Figure 16:
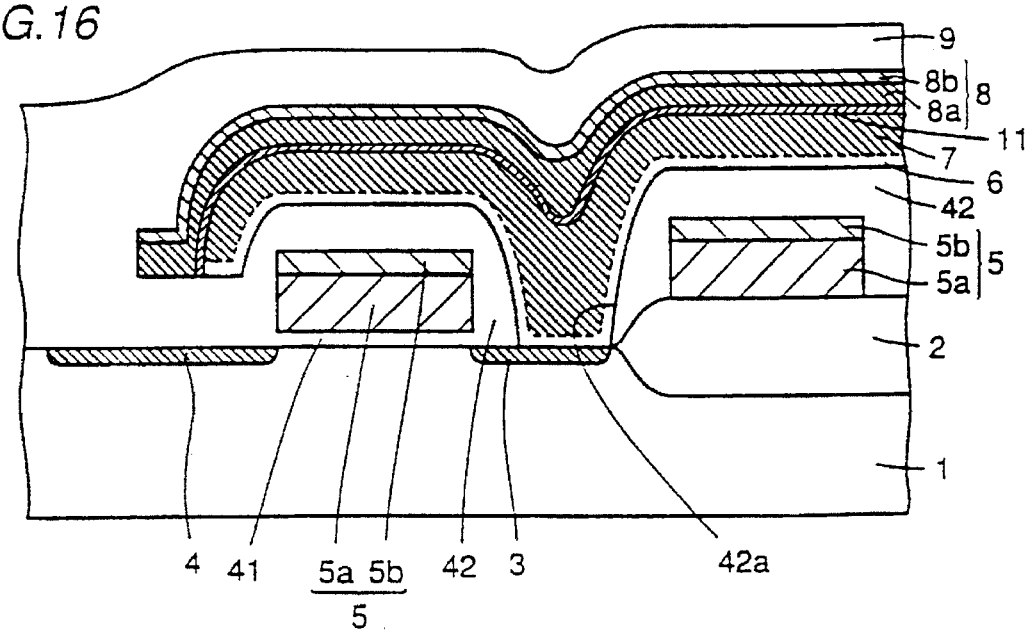
Figure 17:
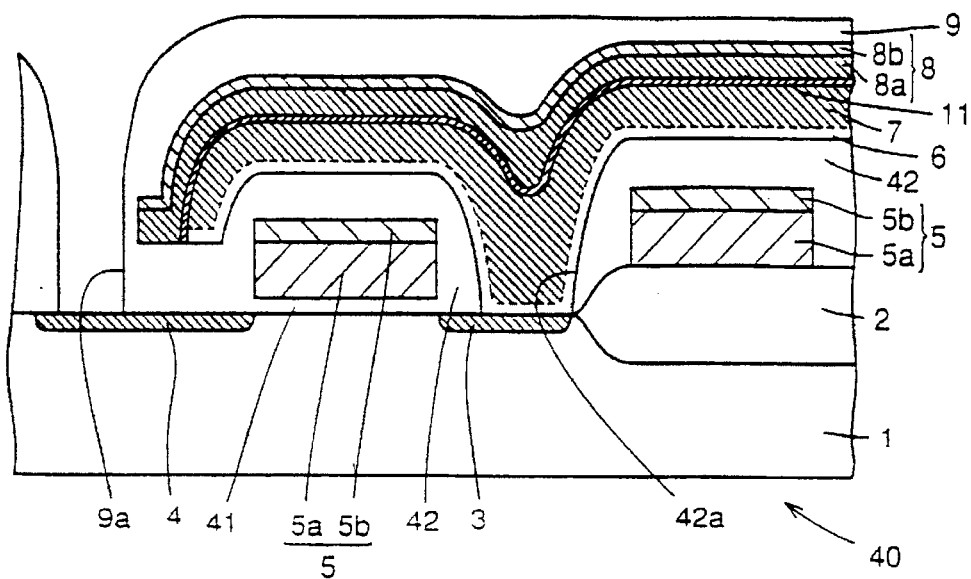

Then with reference to FIG. 12, a resist film 21 is formed to have a predetermined configuration on the surface of the second semiconductor layer 7, and the first semiconductor layer 6a and the second semiconductor layer 7 virtually above the impurity diffusion region 4 are removed by anisotropic etching. With reference to FIG. 13, after the removal of the resist film 21, an insulation layer 11 of $SiO_2$ or the like is formed to have a thickness of about 30 Å–1000 Å on the entire surface of the second semiconductor layer 7 by thermal oxidation. With reference to FIG. 14, a main conductor layer 8a of polysilicon with phosphorus doped as n type impurities having a concentration of about $1 \times 10^{19}$ atoms $cm^{-3}$–$1 \times 10^{21}$ atoms $cm^{-3}$ is deposited on the surface of the insulation film 11 to have a thickness of about 500 Å–5000 Å. Thereafter, further deposited on the main conductor layer 8a is a buffer layer 8b of polysilicon with phosphorus doped as n type impurities having an impurity concentration of $1 \times 10^{14}$ atoms $cm^{-3}$–$1 \times 10^{19}$ atoms $cm^{-3}$, thereby forming an upper electrode 8 comprised of the main conductor layer 8a and the buffer layer 8b. Then with reference to FIG. 15, a resist film 21 having a predetermined configuration is formed on the surface of the upper electrode 8 and the upper electrode 8 virtually above the impurity diffusion region 4 is removed by anisotropic etching. With reference to FIG. 16, an interlayer insulation film 9 of $SiO_2$ or the like is formed on the entire surface of the upper electrode 8 after the removal of the resist film 21. With reference to FIG. 17, a contact hole 9a reaching the impurity diffusion region 4 is formed after sintering of the interlayer insulation film 9 and planarization of the surface.

Figure 18:
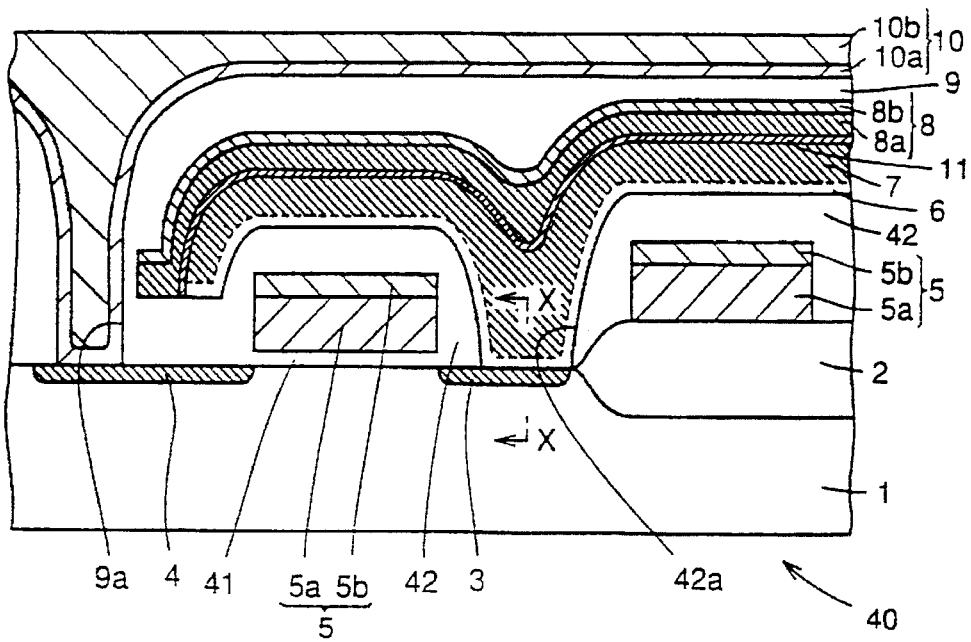

Then with reference to FIG. 18, undoped polysilicon is deposited to have a thickness of about 200 Å–500 Å on the surfaces of the interlayer insulation film 9 and the contact hole 9a to form a buffer layer 10a. Thereafter, polysilicon with n type impurities of a concentration of about $1 \times 10^{19}$ atoms $cm^{-3}$–$1 \times 10^{21}$ atoms $cm^{-3}$ doped is deposited to have a thickness of about 200 Å–5000 Å on the buffer layer 10a to form a main conductor layer 10b. The buffer layer 10a and the main conductor layer 10b form a bit line 10. The foregoing processes complete the semiconductor device 40 shown in FIG. 1.

As described in the foregoing, the provision of the first semiconductor layer 6a can suppress diffusion of the impurities included in the second semiconductor layer 7 into the impurity region 3.

The reason is as follows. In order to diffuse the high concentration phosphorus doped in the second semiconductor layer into the impurity diffusion region 3, the phosphorus should diffuse through the first semiconductor layer 6 with no impurity doped. That is, it is equivalent to that an impurity diffusion source is located distant from the substrate. Therefore, in the same heat treatment, of the less amount of impurities than that in a conventional embodiment reach the substrate, enabling a junction of a desired depth to be obtained.

Figure 19:
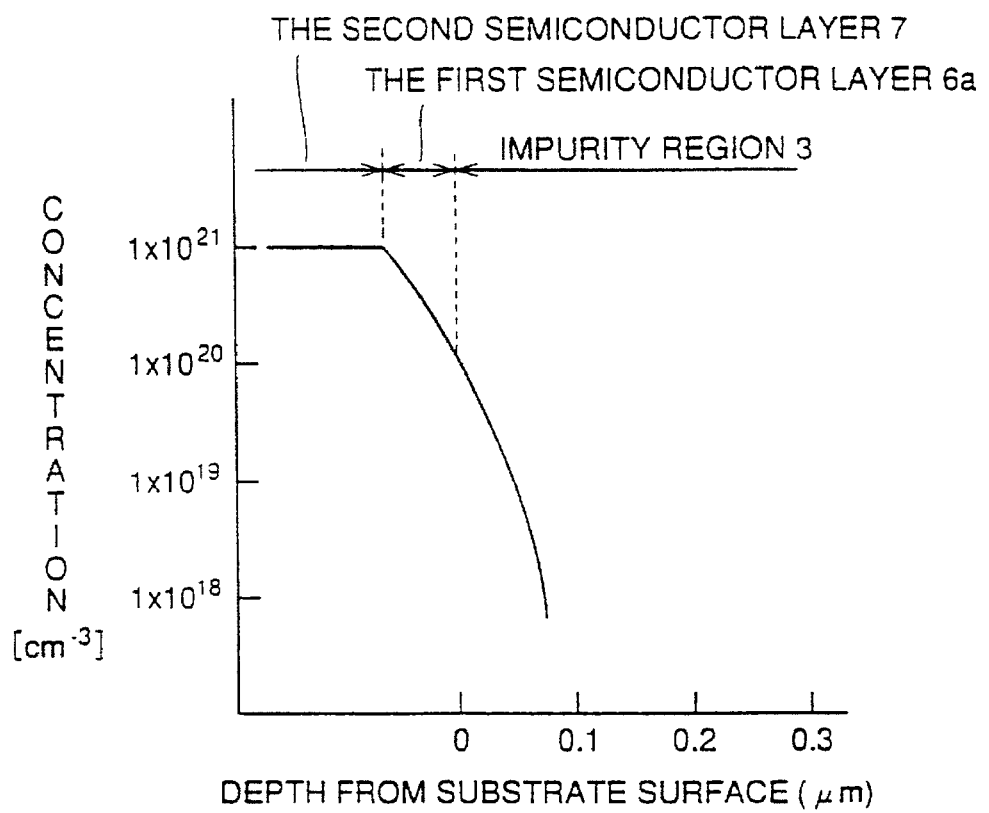
FIG. 19 is a diagram showing a profile of an impurity concentration at a section taken along line X—X of FIG. 1.
Figure 46:
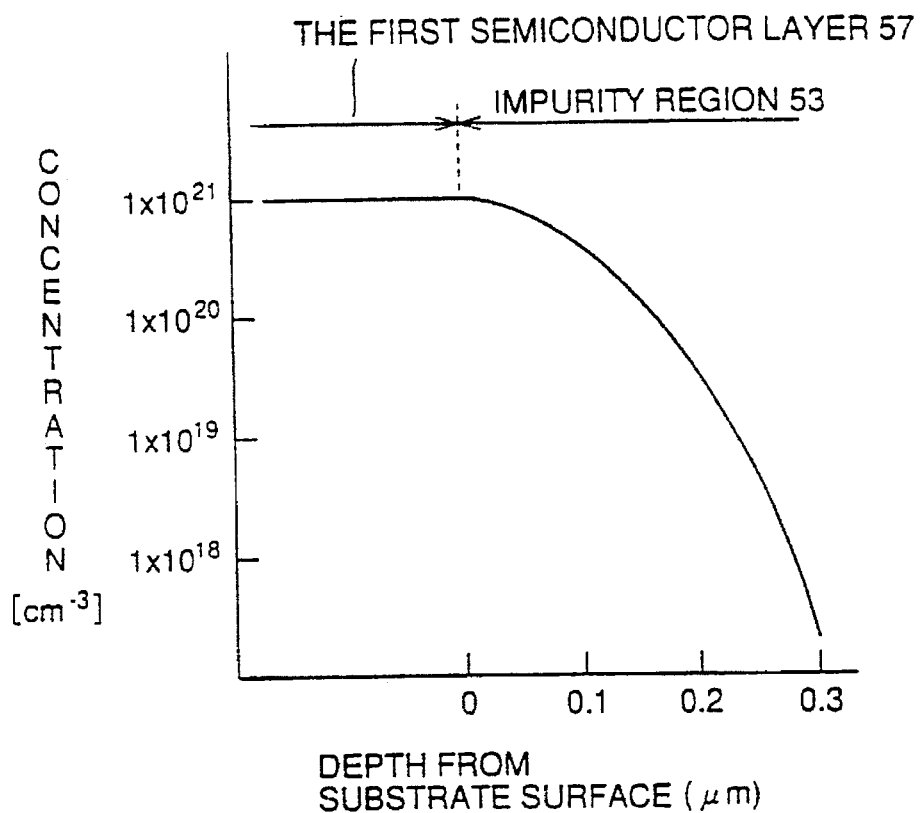
FIG. 46 is a diagram showing a profile of an impurity concentration at a section taken along line X—X of FIG. 30.
Figure 47:
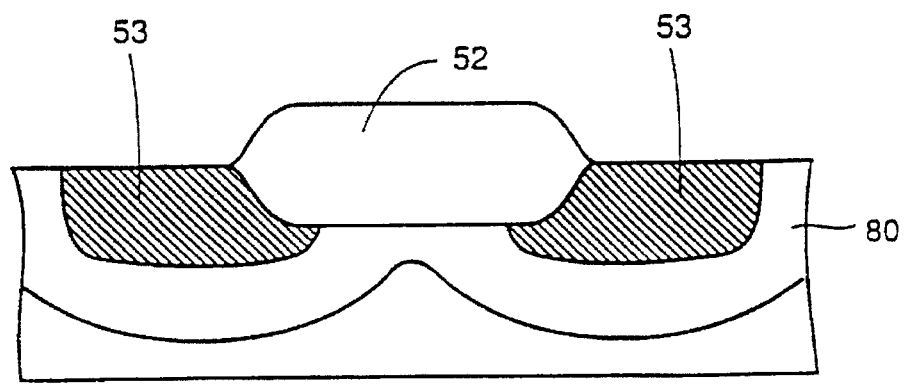
FIG. 47 is a schematic diagram showing deterioration of element characteristics due to expansion of a diffusion region provided in a semiconductor substrate.

FIG. 19 shows a graph of a profile of an impurity concentration at a section taken along line X—X in a junction portion with the impurity diffusion region 3 of FIG. 18. As compared with FIG. 46 showing the profile of a conventional impurity concentration as described above, it can be seen from FIG. 18 that a depth of the junction of the impurities is suppressed. In addition, the same is the case with the junction portion of the bit line 10 with the impurity diffusion region 4.

As a result, the first semiconductor layer 6 and the buffer layer 10a become more conductive due to the diffusion of the impurities from the second semiconductor layer 7 and the main conductor layer 10b to enable electrical junction between the first semiconductor layer 6 and the impurity diffusion region 3 and that between the main conductor layer 10b and the impurity diffusion region 4.

A second embodiment of a semiconductor device according to the present invention will be described.

Figure 20:
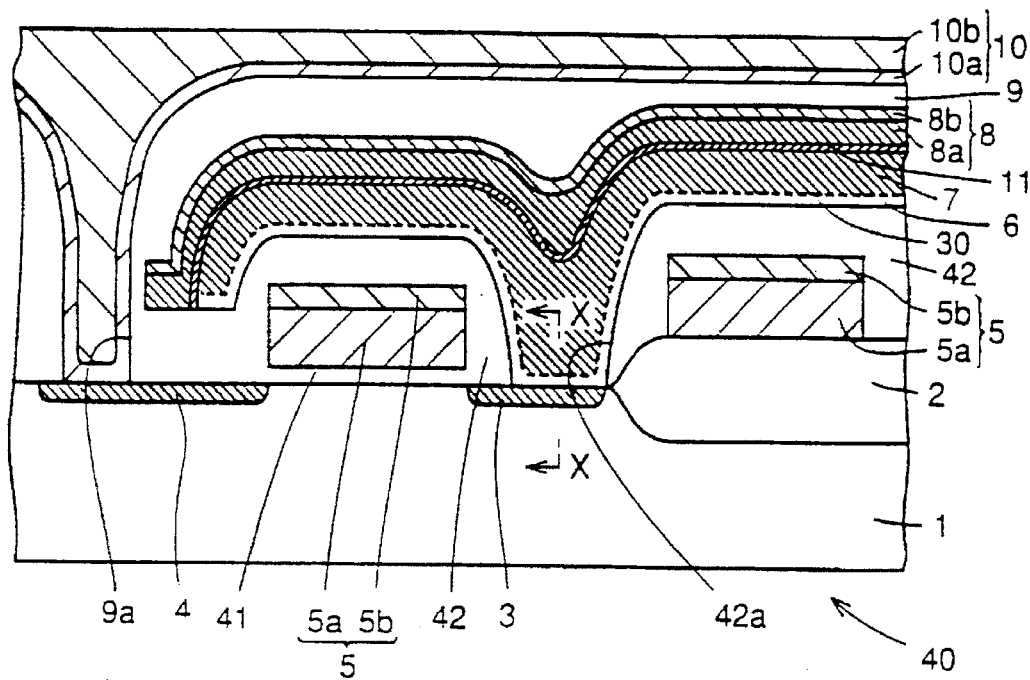
FIG. 20 is a sectional view of a semiconductor device according to a second embodiment of the present invention.

With reference to FIG. 20, as compared with the arrangement of the first embodiment as described above, an oxide film 30 is provided between the first semiconductor layer and the second semiconductor layer. Provision of the oxide film enables further suppression of diffusion of the impurities from the second semiconductor layer.

Again with reference to FIG. 10, in a method of manufacturing the oxide film 30 in this case, a first semiconductor layer 6 is formed and then left in atmosphere for about an hour to form a native oxide film having a thickness of in the range of 5–20 Å, preferably 10 Å. This is because the conductivities of the first semiconductor layer and the second semiconductor layer can be maintained because a polysilicon layer is deposited in cavities such as pin holes in an oxide film of uneven thickness made by natural oxidation.

Even without such holes as pinholes, if the oxide film has a thickness of about 10 Å, a tunnel current flows to make the first semiconductor layer and the second semiconductor layer conductive to each other.

The above-described arrangement can produce the same function and effect as those of the first embodiment. Although in the foregoing, a description was made of a case in which the oxide film 30 is provided between the first and the second semiconductor layers, the same function and effect can be obtained by similarly providing an oxide film between the buffer layer 10a and the main conductor layer 10b forming the bit line 10.

In each of the above-described embodiments, ions such as Si, Ge, O, C and F may be implanted in an interface between the first semiconductor layer 6a and the semiconductor substrate 1. This is intended for improving conductivity by implanting the above-described ions to remove a thin native oxide film formed at the interface.

Although in the above-described embodiments, undoped polysilicon is used for the first semiconductor layer 6a and the buffer layer 10a constituting the bit line 10, low-concentration polysilicon can be used to obtain the same function and effect.

In addition, while polysilicon with impurities doped is deposited for the second conductor layer, the same function and effect can be obtained by doping impurities into polysilicon during its deposition.

Although an n type impurity diffusion region is formed in a p type semiconductor substrate in each of the above-described embodiments, a p type impurity diffusion region can be formed in an n type semiconductor substrate to have the same function and effect.

A third embodiment of the present invention will be described in the following. In the above-described first and second embodiments, an undoped polysilicon layer or a polysilicon layer with low-concentration impurities of the same conductivity type (n type in the first and the second embodiments) as that of the impurity diffusion region is deposited on the first semiconductor layer 6 and the buffer layer 10a constituting the bit line 10. In the present embodiment, a polysilicon layer with impurities doped having the opposite conductivity type to that of the impurity diffusion region is deposited on the first semiconductor layer 6a and the buffer layer 10a.

Figure 21:
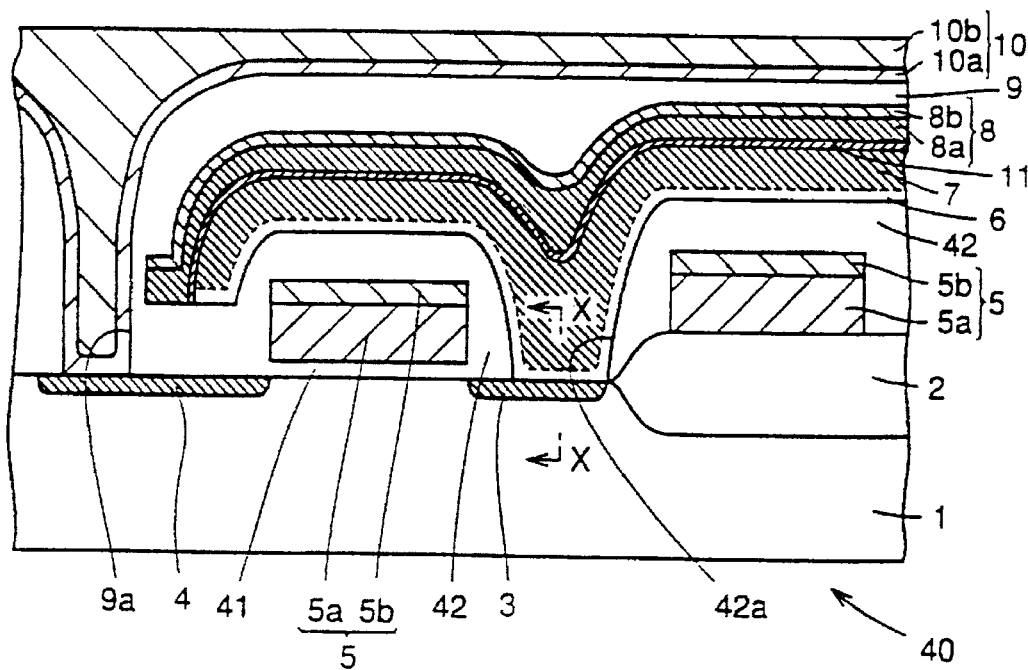
FIG. 21 is a sectional view showing a semiconductor device according to a third embodiment of the present invention.

FIG. 21 is a sectional view showing the semiconductor device manufactured according to the present embodiment. Since the structure of the device is the same as that shown in FIG. 1 and therefore no description will be made thereof.

A method of manufacturing a semiconductor device according to the present embodiment will be described in the following.

The method has the same steps for forming the contact hole 42a at the interlayer insulation film 42 to reach the impurity diffusion region as described in the first embodiment and shown in FIGS. 2 to 9. No description will be therefore given to the steps.

Figure 22:
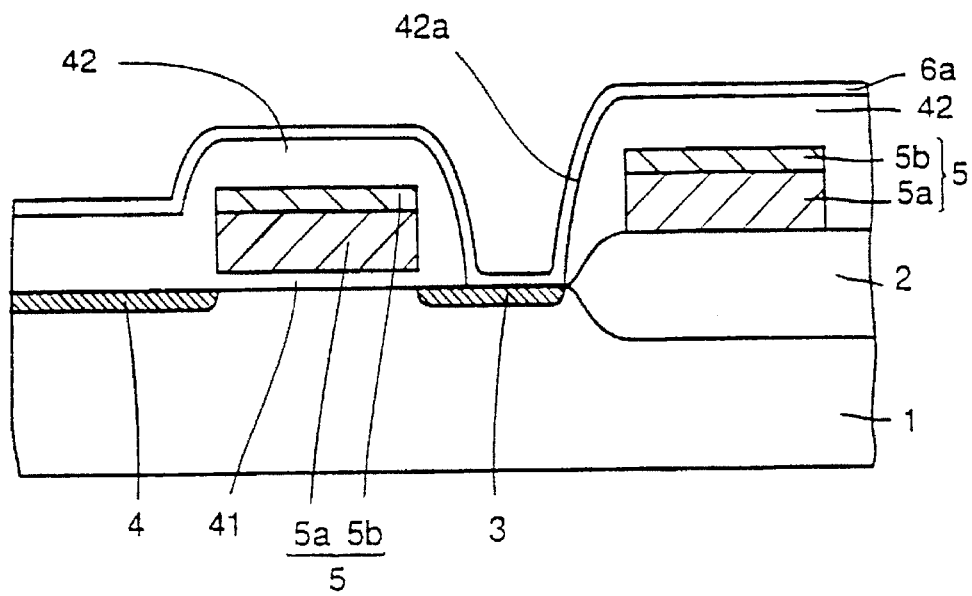
FIG. 22 is a first diagram showing a method of manufacturing the semiconductor device according to the third embodiment of the present invention.
Figure 23:
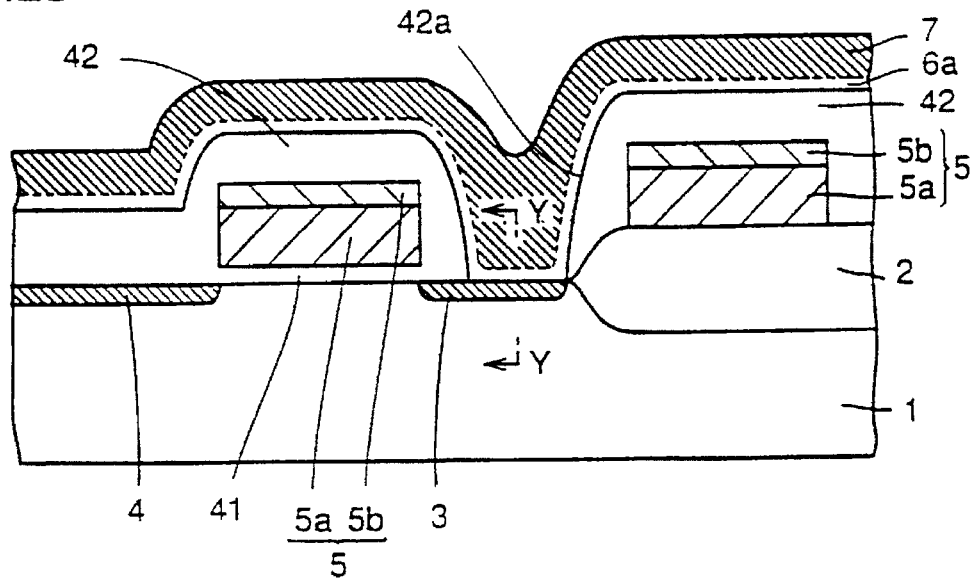
FIG. 23 is a second diagram showing a method of manufacturing the semiconductor device according to the third embodiment of the present invention.

Then with reference to FIG. 22, polysilicon with p type impurities having a concentration of about $1 \times 10^{14}$ atoms $cm^{-3}$–$1 \times 10^{21}$ atoms $cm^{-3}$ doped is deposited to have a thickness of 200 Å–5000 Å along the surfaces of the insulation film 42 and the contact hole 42a to form a first semiconductor layer 6a. With reference to FIG. 23, polysilicon with n type impurities having a concentration of $1 \times 10^{19}$ atoms $cm^{-3}$–$1 \times 10^{21}$ atoms $cm^{-3}$ doped is deposited to have a thickness of 200 Å–5000 Å along the surface of the first semiconductor layer 6a to form a second semiconductor layer 7.

Figure 24:
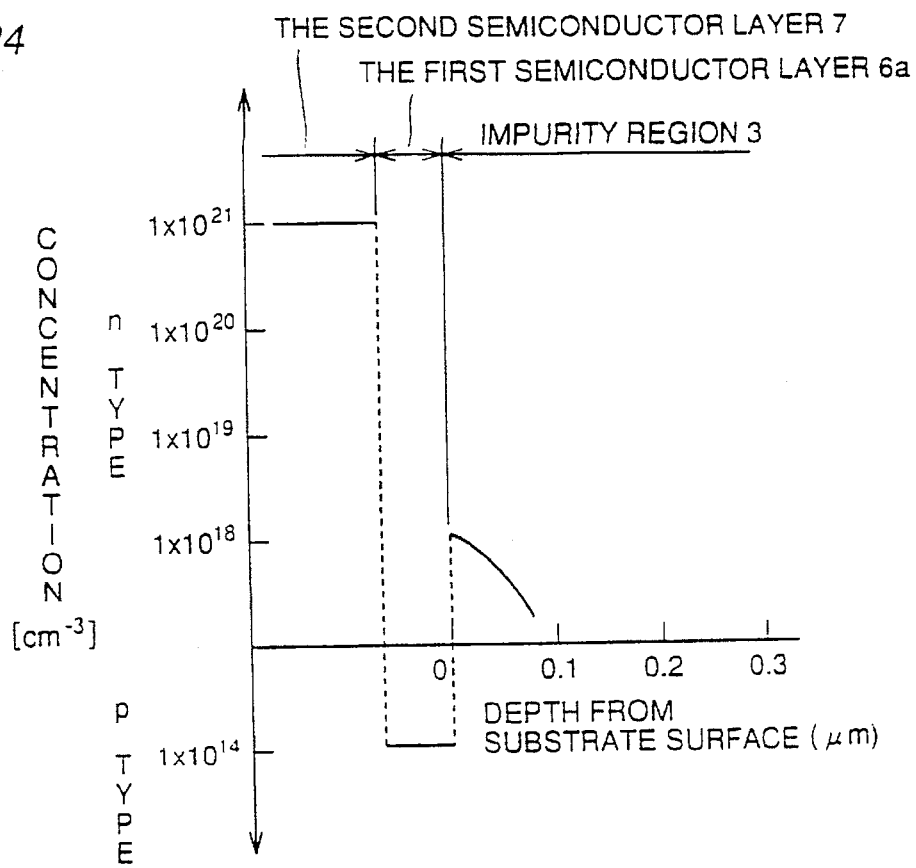
FIG. 24 is a diagram showing a profile of an impurity concentration taken along line Y—Y of FIG. 23.

A profile of the impurity concentration at a section taken along Y—Y in the figure at this time is shown in FIG. 24.

Thereafter, through the same steps as those of the first embodiment, the semiconductor device having the sectional structure shown in FIG. 21 can be formed.

Figure 25:
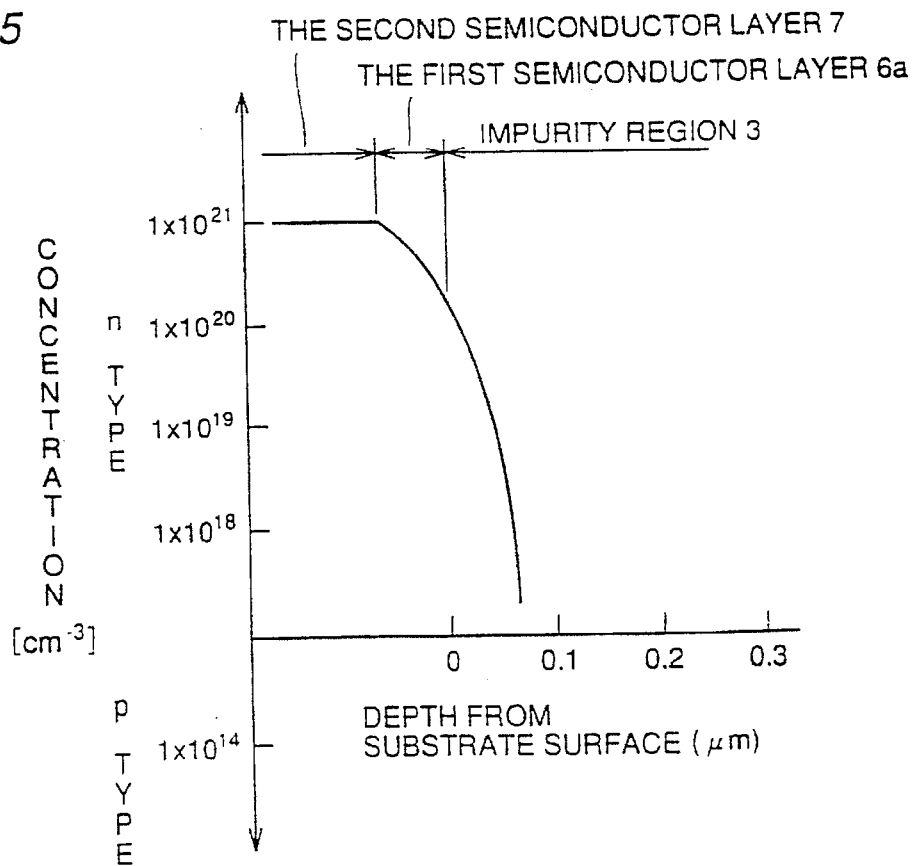
FIG. 25 is a diagram showing a profile of an impurity concentration at a section taken along line X—X of FIG. 21.
Figure 26:
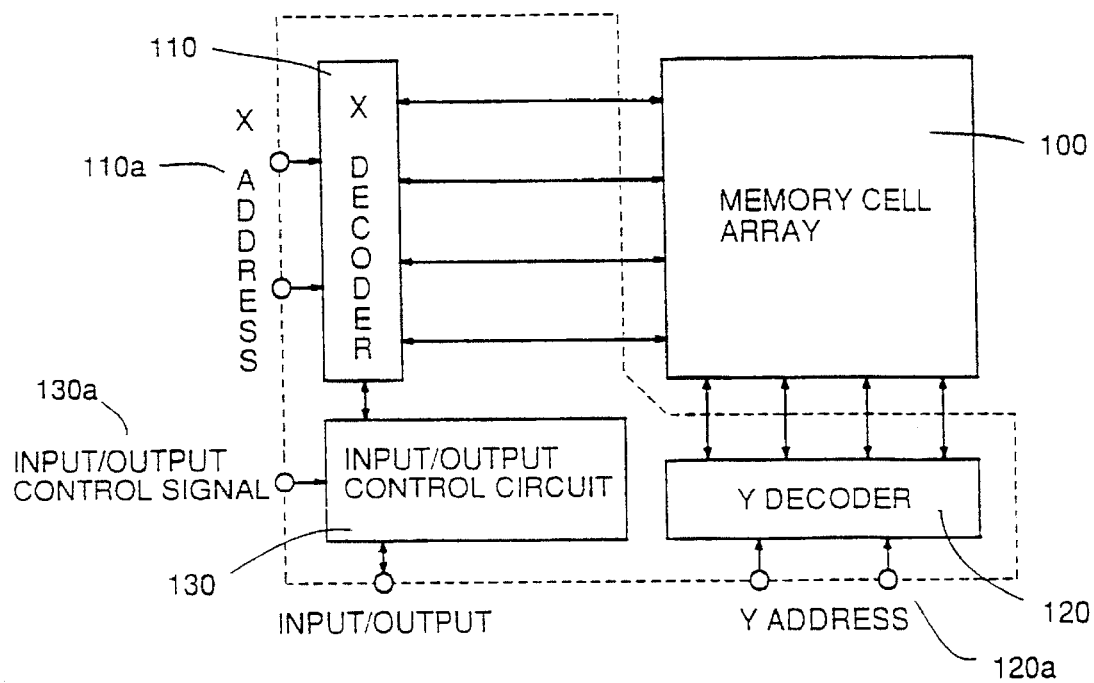
FIG. 26 is a schematic diagram showing a basic structure of a DRAM.
Figure 27:
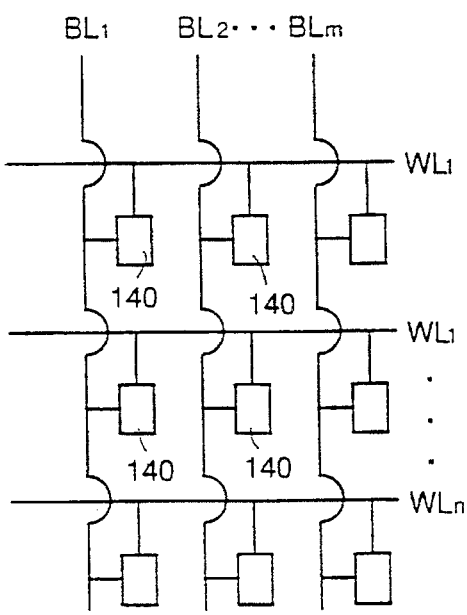
FIG. 27 is a schematic diagram showing an arrangement of a semiconductor device in a memory cell array.
Figure 28:
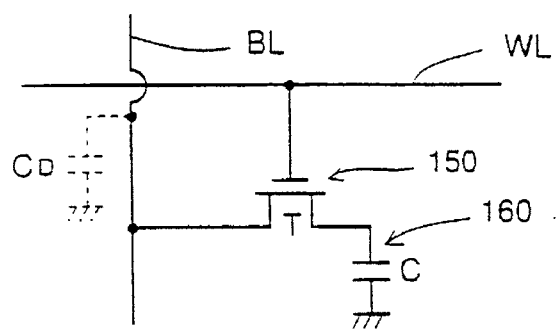
FIG. 28 is a diagram showing an equivalent circuit of the semiconductor device.

Thus formed semiconductor device has a profile of the impurity concentration at the section taken along line X—X of FIG. 21 as shown in FIG. 25, which shows that the device can be formed without increasing a junction depth of the impurity region 3.

Similarly, the buffer layer 10a forming the interconnection layer 10 of the third embodiment can produce the same function and effect by using a polysilicon layer with impurities of the opposite conductivity to that of the impurity diffusion region 4.

In the respective embodiments, although the impurities in the second semiconductor layer 7 are reduced through diffusion, the amount of the diffused impurities from the second semiconductor layer 7 is much smaller than that of the impurities included in the second semiconductor layer. Therefore, the impurity concentration of the second semiconductor layer is supposed not to be affected.

The semiconductor device according to the present invention is provided with the second semiconductor layer including impurities of a concentration higher than that of a first semiconductor layer formed along the surface of the first semiconductor layer.

Such provision reduces intensification of an electric field at an end portion of a capacitor constituted by the first semiconductor layer and the second semiconductor layer, thereby preventing distraction of the capacitor.

Furthermore, the semiconductor device according to the present invention is provided with a conductor layer, and a first semiconductor layer formed on the conductor layer with an interlayer insulation film provided therebetween. A second semiconductor layer including impurities whose concentration is higher than that of the first semiconductor layer is provided on the first semiconductor layer.

As a result, a parasitic capacitance between a lower electrode of the capacitor constituted by the first semiconductor layer and the second semiconductor layer, and the conductor layer is reduced to obtain a high-operation rate of the semiconductor device.

Furthermore, the semiconductor device according to the present invention is provided with a first conductor layer, which serves as the lower electrode of the capacitor and a second conductor layer, which serves as the upper electrode of the capacitor with an insulation film provided therebetween. The first conductor layer and the second conductor layer respectively have first and second buffer layers at regions adjacent to the insulation film. Provided on the opposite sides of each buffer layer to the insulation film are first and second main conductor layers.

Such provision reduces a parasitic capacitance between the first conductor layer and the second conductor layer to increase an operation rate of the semiconductor device.

According to a method of manufacturing a semiconductor device of the present invention, a first semiconductor layer is formed and then a second semiconductor layer including impurities of a predetermined concentration is formed on the first layer.

With such a structure, the high-concentration impurities doped in the second semiconductor layer should pass through the first layer in order to diffuse into the impurity region, which prevents the impurities included in the second semiconductor layer from diffusing into the impurity region and expanding.

Furthermore, according to the method of manufacturing the semiconductor device of the present invention, a native oxide film is formed between the first semiconductor layer and the second semiconductor layer. Such provision further suppresses diffusion of the impurities included in a lower electrode into the impurity region, thereby preventing expansion of the impurity region at a heat treatment in the respective manufacturing steps.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:
   forming a field oxide region on a main surface of a semiconductor substrate;
   forming an impurity region containing impurities on the main surface of the semiconductor substrate;
   forming an insulation film having an upper surface and a lower surface, with the lower surface on said field oxide region and on the main surface of the semiconductor substrate;
   forming a contact hole with surfaces through the insulation film reaching said impurity region on the main surface of said semiconductor substrate,
   depositing a first layer having an upper surface and a lower surface on the surfaces of said contact hole and on the upper surface of said insulation film,
   forming a second layer doped with impurities and having an upper surface and a lower surface on the upper surface of said first layer,
   forming an insulation layer directly on and along the upper surface of the second layer, and
   subjecting said second layer and said first layer to a heat treatment to diffuse impurities from said second layer into and through said first layer to electrically connect said second layer and said impurity region on the main surface of said semiconductor substrate.

2. The method of manufacturing a semiconductor device according to claim 1, wherein said first layer is formed of undoped polysilicon and said second layer is formed of polysilicon with doped impurities of a concentration of $1 \times 10^{19}$ atoms cm$^{-3}$–$1 \times 10^{21}$ atoms cm$^{-3}$ doped.

3. The method of manufacturing a semiconductor device according to claim 1, wherein said step of forming the first layer comprises a step of depositing polysilicon with doped impurities of a conductivity type opposite to that of the impurities of said impurity region.

4. The method of manufacturing a semiconductor device according to claim 1, further comprising the steps of:
   forming an insulation layer on said second layer, and
   forming a third layer doped with impurities on the insulation layer.

5. A method of manufacturing a semiconductor device comprising the steps of:
   forming a field oxide region on a main surface of a semiconductor substrate,
   forming an impurity region on a main surface of the semiconductor substrate,
   forming an insulation film having an upper surface and a lower surface, with the lower surface on said field oxide region and on the main surface of the semiconductor substrate,
   forming a contact hole with surfaces through the insulation film reaching said impurity region on the main surface of said semiconductor substrate,
   depositing a first semiconductor layer having an upper surface and a lower surface along the surfaces of said contact hole and on the upper surface of said insulation film,
   forming a second semiconductor layer doped with impurities and having an upper surface and a lower surface along the upper surface of the first semiconductor layer,
   forming an insulation layer having an upper surface and a lower surface directly on and along the upper surface of the second semiconductor layer, and
   forming a third semiconductor layer doped with impurities along the upper surface of the insulation layer, wherein
   the impurities included in said second semiconductor layer diffusing into said first semiconductor layer through a heat treatment to electrically connect the first layer with said impurity region at said contact hole.

6. The method of manufacturing a semiconductor device according to claim 5, wherein
   said step of forming the first semiconductor layer includes a step of forming undoped polysilicon, and
   said step of forming the second semiconductor layer includes a step of forming polysilicon with doped impurities of a concentration of $1 \times 10^{19}$ atoms cm$^{-3}$–$1 \times 10^{21}$ atoms cm$^{-3}$.

7. A method of manufacturing a semiconductor device comprising the steps of:
   forming an impurity region on a main surface of a semiconductor substrate,
   forming an insulation film having a contact hole with surfaces reaching said impurity region on the main surface of said semiconductor substrate,
   forming a first semiconductor layer having an upper surface and a lower surface along the surfaces of said contact hole and said insulation film,
   forming a native oxide film of about 5–20 Å in thickness by subjecting said first layer to an atmosphere,
   forming a second semiconductor layer doped with impurities and having an upper surface and a lower surface along the upper surface of the first semiconductor layer,
   forming an insulation layer having an upper surface and a lower surface along the upper surface of the second semiconductor layer, and
   forming a third semiconductor layer doped with impurities along the upper surface of the insulation layer, and
   the impurities included in said second semiconductor layer diffusing into said first semiconductor layer through a heat treatment to electrically connect the first layer with said impurity region at said contact hole.

8. A method of manufacturing a semiconductor device comprising the steps of:
   forming an insulation film on a main surface of a semiconductor substrate,
   forming a conductor layer on the insulation film,
   implanting impurities in the main surface of said semiconductor substrate by using said conductor layer as a mask to form an impurity region,
   covering said semiconductor substrate and said conductor layer to form an interlayer insulation film having an upper surface, lower surface and a contact hole with surfaces reaching said impurity region, depositing a first semiconductor layer with an upper surface and a lower surface along the surfaces of said contact hole and on the upper surface of said interlayer insulation film, forming a second semiconductor layer doped with impurities and having an upper surface and a lower surface along the upper surface of the first semiconductor layer, forming an insulation layer directly on and along the upper surfaces of the second semiconductor layer, and a third semiconductor layer doped with impurities and having an upper surface and a lower surface along the upper surface of the insulation layer, wherein the impurities included in said second semiconductor layer diffuse into the first semiconductor layer by a heat treatment and the first semiconductor layer electrically connects with said impurity region at said contact hole.

9. The method of manufacturing a semiconductor device according to claim 8, wherein said step of forming the first semiconductor layer includes a step of depositing undoped polysilicon, and said step of forming the second semiconductor layer includes a step of depositing a polysilicon layer with impurities of a concentration of $1\times10^{19}$ atoms $cm^{-3}$–$1\times10^{21}$ atoms $cm^{-3}$ doped.

10. The method of manufacturing a semiconductor device according to claim 8, wherein said step of forming the first semiconductor layer includes a step of depositing polysilicon with impurities of a conductivity type opposite to that of the impurities included in said impurity region.

11. A method of manufacturing a semiconductor device comprising the steps of:

forming an insulation film on a main surface of a semiconductor substrate, forming a conductor layer on the insulation film, implanting impurities in the main surface of said semiconductor substrate by using said conductor layer as a mask to form an impurity region, covering said semiconductor substrate and said conductor layer to form an interlayer insulation film having a contact hole with surfaces reaching said impurity region, forming a first semiconductor layer with an upper surface and a lower surface along the surfaces of said contact hole and said interlayer insulation film, forming a native oxide film of about 5–20 Å in thickness by subjecting said first layer to an atmosphere, forming a second semiconductor layer doped with impurities and having an upper surface and a lower surface along the upper surface of the first semiconductor layer, forming an insulation layer along the upper surface of the second semiconductor layer, and a third semiconductor layer doped with impurities and having an upper surface and a lower surface along the upper surface of the insulation layer, wherein the impurities included in said second semiconductor layer diffuse into the first semiconductor layer by a heat treatment and the first semiconductor layer electrically connects with said impurity region at said contact hole.

12. The method according to claim 1, comprising depositing said insulating layer film on said field oxide region and the main surface of the semiconductor substrate.

13. The method according to claim 5, comprising depositing said insulating film on said field oxide region and on said main surface of the semiconductor substrate.

14. The method according to claim 8, comprising depositing said interlayer insulating film on said semiconductor substrate and said conductor layer.

15. The method according to claim 1, comprising depositing said second layer doped with impurities on the upper surface of said first layer.

16. The method according to claim 5, comprising depositing said second semiconductor layer doped with impurities on said first semiconductor layer.

17. The method according to claim 8, comprising depositing said second semiconductor layer doped with impurities on said first semiconductor layer.

* * * * *